(12) United States Patent
Hysong et al.

(10) Patent No.: US 8,813,008 B2
(45) Date of Patent: Aug. 19, 2014

(54) CONFLICT DETECTION WITH FUNCTION MODELS

(71) Applicant: Red X Holdings LLC, Anacortes, WA (US)

(72) Inventors: Craig G. Hysong, Saline, MI (US); Harry B. Flotemersch, Goodrich, MI (US); Carlos A. Hernandez, Cadiz (ES); John P. Abrahamian, Tolland, CT (US)

(73) Assignee: Red X Holdings LLC, Anacortes, WA (US)

( * ) Notice: Subject to any disclaimer, the term of this patent is extended or adjusted under 35 U.S.C. 154(b) by 36 days.

(21) Appl. No.: 13/803,590

(22) Filed: Mar. 14, 2013

(65) Prior Publication Data

US 2014/0040840 A1    Feb. 6, 2014

Related U.S. Application Data

(60) Provisional application No. 61/678,973, filed on Aug. 2, 2012.

(51) Int. Cl.
*G06F 17/50* (2006.01)
*G06Q 10/10* (2012.01)
*G06F 17/00* (2006.01)

(52) U.S. Cl.
CPC ............... *G06F 17/00* (2013.01); *G06F 17/50* (2013.01); *G06Q 10/10* (2013.01)
USPC ......................................... 716/106; 716/111

(58) Field of Classification Search
CPC ..... G06F 17/50; G06F 2217/04; G06F 17/00; G06F 17/5004; G06Q 10/087; G06Q 30/0253; G06Q 30/0621; G06Q 30/0643
USPC .................................................. 716/106, 111
See application file for complete search history.

(56) References Cited

U.S. PATENT DOCUMENTS

| | | | |
|---|---|---|---|
| 7,069,192 B1* | 6/2006 | Freitag | 703/1 |
| 8,214,423 B2* | 7/2012 | Freitag | 709/201 |
| 2009/0148050 A1* | 6/2009 | Reghetti et al. | 382/219 |
| 2009/0273598 A1* | 11/2009 | Reghetti et al. | 345/419 |
| 2010/0138762 A1* | 6/2010 | Reghetti et al. | 715/765 |
| 2010/0223032 A1* | 9/2010 | Reghetti et al. | 703/1 |

\* cited by examiner

*Primary Examiner* — Sun Lin
(74) *Attorney, Agent, or Firm* — Stoel Rives LLP

(57) ABSTRACT

Systems and methods for detecting design conflicts of a product or process are disclosed. A method for detecting design conflicts includes processing a function model of a product or process to identify a plurality of descriptions of functions to be performed by the product or process. The method includes detecting in the plurality of descriptions a first description and a second description in which the first description includes a first design component name that matches a second design component name of the second description, a first descriptive noun that matches a second descriptive noun of the second description, and a first active verb that does not match a second active verb of the second description. The method further includes flagging a relationship between the first description and the second description as a first conflict type and displaying, on a display device, information regarding the first conflict type.

38 Claims, 24 Drawing Sheets

| | Components List | Process! | | | | | | |
|---|---|---|---|---|---|---|---|---|
| Conflict/Conflict Table | | | | | | | | |
| | Description | Ty | Index | Verb | Noun | Bill of Material | C1 | C2 | C3 |
| 29 | Control surface finish of protector | X | 28 | control | surface finish | protector | 0 | 0 | 0 |
| 30 | Minimize outer crimp joint compression | X | 29 | minimize | compression | Outer Crimp Joint | 39 | 0 | 0 |
| 31 | Prevent diaphragm fatigue | ● | 30 | prevent | fatigue | Diaphragm | 38 | 0 | 0 |
| 32 | Contain Fuel at outer crimp joint | Y | 31 | contain | | Outer Crimp Joint | 0 | 0 | 0 |
| 33 | Control outer joint compression (B) | ● | 32 | control | compression | | 0 | 0 | 0 |
| 34 | Prevent upper housing material breakdown | ● | 33 | prevent | material | Upper Housing | 0 | 0 | 0 |
| 35 | Prevent Diaphragm material breakdown | ● | 34 | prevent | material | Diaphragm | 21 | 0 | 0 |
| 36 | Prevent lower housing material breakdown | ● | 35 | prevent | material | Lower Housing | 0 | 0 | 0 |
| 37 | Control crimp geometry | ● | 36 | control | geometry | | 0 | 0 | 0 |
| 38 | Prevent diaphragm fatigue | ● | 37 | prevent | fatigue | Diaphragm | 31 | 0 | 0 |
| 39 | Maximize outer crimp joint compression | ● | 38 | maximize | compression | Outer Crimp Joint | 30 | 0 | 0 |
| 40 | Control outer crimp joint height | X | 39 | control | height | Outer Crimp Joint | 0 | 0 | 0 |
| 41 | Control upper housing thickness | X | 40 | control | thickness | Upper Housing | 0 | 0 | 0 |
| 42 | Control lower housing thickness | X | 41 | control | thickness | Lower Housing | 0 | 0 | 0 |
| 43 | Control diaphragm thickness | X | 42 | control | thickness | Diaphragm | 0 | 0 | 0 |
| 44 | Control outer crimp pressure | X | 29 | control | pressure | Outer crimp | 0 | 0 | 0 |

Total Conflicts: 12
Red Count: 4

| Cell ID | Description | Conflict | Process Measurable Parameter | Reliability Black Dot Candidate | Upper Housing | Spring | Protector | Valve | Valve Seat | Diaphragm | Lower Housing | Inner Crimp Joint | Outer Crimp Joint |
|---|---|---|---|---|---|---|---|---|---|---|---|---|---|
| 4 | Prevent Fuel leaks | | | | | | | | | | | | |
| 4.1 | Contain Fuel at inner crimp joint | | | | | | | | | | | 1 | |
| 4.1.1 | Control inner crimp joint compression | | | | | | | | | | | 1 | |
| 4.1.1.1 | Prevent Valve material breakdown | | | | | | | | 1 | | | | |
| 4.1.1.2 | Prevent diaphragm material breakdown | | | | | | | | | | 1 | | |
| 4.1.1.3 | Prevent protector material breakdown | | | | | | 1 | | | | | | |
| 4.1.1.4 | Control inner crimp peen geometry | | | | | | | | | | | 1 | |
| 4.1.1.4.2 | Prevent diaphragm fatigue | | | x | | | | | | | 1 | | |
| 4.1.1.4.1 | Prevent protector fatigue | | | x | | | 1 | | | | | | |
| 4.1.2 | Maximize inner crimp joint compression | x | | | | | | | | | | | |
| 4.1.2.1 | Control valve upset volume | | | | | | | 1 | | | | | |
| 4.1.2.1.1 | Control valve stem height | | x | | | | | 1 | | | | | |
| 4.1.2.1.2 | control valve stem diameter | | x | | | | | 1 | | | | | |
| 4.1.2.2 | Control valve upset shape | | | | | | | 1 | | | | | |
| 4.1.2.2.1 | Control tool end geometry | | x | | | | | 1 | | | | | |
| 4.1.2.2.2 | Control tool peen rpm | | x | | | | | 1 | | | | | |
| 4.1.2.3 | Control part stack up | | | | | | 1 | | | | 1 | | |
| 4.1.2.3.1 | Control protector thickness | | x | | | | 1 | | | | 1 | | |
| 4.1.2.3.2 | Control diaphragm thickness | | x | | | | | | | | 1 | | |
| 4.2 | Prevent diaphragm permeation | | | x | | | | | | | 1 | | |
| 4.2.1 | Prevent diaphragm material breakdown | | | x | | | | | | | | | |
| 4.2.2 | Prevent diaphragm damage | | | x | | | | | | | | | |
| 4.2.2.1 | Minimize inner crimp joint compression | x | | | | | | | | | | 1 | |
| 4.2.2.2 | Control the valve OD geometry | | x | | | | | 1 | | | | | |

| Cell ID | Description | Conflict | Process Measurable Parameter | Reliability Black Dot Candidate | Upper Housing | Spring | Protector | Valve | Valve Seat | Diaphragm | Lower Housing | Inner Crimp Joint | Outer Crimp Joint |
|---|---|---|---|---|---|---|---|---|---|---|---|---|---|
| 4.2.2.3 | Control the valve OD surface finish | | x | | | | | 1 | | | | | |
| 4.2.2.4 | Control geometry of upper housing bend | | x | | 1 | | | | | | | | |
| 4.2.2.5 | Control surface finish of upper housing bend | | x | | 1 | | | | | | | | |
| 4.2.2.6 | Control geometry of outside protector at bend | | x | | | | 1 | | | | | | |
| 4.2.2.7 | Control surface finish of protector | | x | | | | 1 | | | | | | |
| 4.2.2.8 | Minimize outer crimp joint compression | x | x | | | | | | | | | | 1 |
| 4.2.3 | Prevent diaphragm fatigue | | | x | | | | | | 1 | | | |
| 4.3 | Contain Fuel at outer crimp joint | | | | | | | | | | | | 1 |
| 4.3.1 | Control outer joint compression | | | | | | | | | | | | 1 |
| 4.3.1.1 | Prevent upper housing material breakdown | | | x | 1 | | | | | | | | |
| 4.3.1.2 | Prevent diaphragm material breakdown | | | x | | | | | | 1 | | | |
| 4.3.1.3 | Prevent lower housing material breakdown | | | x | | | | | | | 1 | | |
| 4.3.1.4 | Control outer crimp geometry | | | | | | | | | | | | 1 |
| 4.3.1.4.1 | Prevent diaphragm fatigue | | | x | | | | | | 1 | | | |
| 4.3.2 | Maximize outer crimp joint compression | x | | | | | | | | | | | 1 |
| 4.3.2.1 | control outer crimp joint height | | x | | 1 | | | | | | | | |
| 4.3.2.1.1 | control upper housing thickness | | x | | 1 | | | | | | | | |
| 4.3.2.1.2 | control lower housing thickness | | x | | | | | | | | 1 | | |
| 4.3.2.1.3 | Control diaphragm thickness | | x | | | | | | | 1 | | | |
| 4.3.2.2 | Control outer crimp pressure | | x | | | | | | | | | | 1 |

| | Description | Ty | Index | Verb | Noun | Bill of Material | C1 | C2 | C3 |
|---|---|---|---|---|---|---|---|---|---|
| 13 | Control rudder plane angle to ship stern | ● | 12 | control | angle | Rudder;Stern; ship | 27 | 27 | 27 |
| 14 | Control distance to be within cannonball f | ● | 13 | control | range | Cannon | 27 | 27 | 0 |
| 15 | Withstand enemy cannon attack | ● | 14 | Attack | enemy | Cannon | 0 | 0 | 0 |
| 16 | Minimize exposure of broadside to enemy | ● | 15 | minimize | enemy | Broadside | 7 | 0 | 0 |
| 17 | Maximize strength of structure above wat | ● | 16 | maximize | structure | Waterline | 0 | 0 | 0 |
| 18 | Heavy Iron clad skin on topside of ship | ○ | 17 | | | ship | 0 | 0 | 0 |
| 19 | Minimize impact energy of cannonballs | ● | 18 | Attack | | | 0 | 0 | 0 |
| 20 | Minimize impact energy of cannonballs | ● | 19 | minimize | energy | Cannon;Cannonball | 0 | 0 | 0 |
| 21 | Angled weatherdeck sides above waterlin | ● | 20 | | angle | Waterline;weatherdeck | 0 | 0 | 0 |
| 22 | Minimize structure on weatherdeck | ● | 21 | minimize | structure | weatherdeck | 37 | 0 | 0 |
| 23 | Locate Engine & Crew below waterline | ● | 22 | locate | | Waterline;Engine | 0 | 0 | 0 |
| 24 | Navigate hull through a desired course | ● | 23 | Navigate | | Hull | 0 | 0 | 0 |
| 25 | Control ship hull direction | ● | 24 | control | direction | Hull;ship | 0 | 0 | 0 |
| 26 | Adjust balance of side forces to ship rear | ● | 25 | | force | ship | 28 | 0 | 0 |
| 27 | Control rudder plane angle to ship stern | ● | 26 | control | angle | Rudder;Stern;Ship | 0 | 0 | 0 |

Total Conflicts: 23
Red Count: 14
Yellow Count: 9

Design Conflicts – CSS Merrimac
Components  Process!
Conflict/Conflict Table

Reference Count Pareto List (Top 10)

Conflict Pareto List (Top 10)

FIG. 15

CONFLICT DETECTION WITH FUNCTION MODELS

RELATED APPLICATIONS

This application claims the benefit under 35 U.S.C. §119 (e) of U.S. Provisional Patent Application No. 61/678,973 entitled "Conflict Detection with Function Models" and filed on Aug. 2, 2012, which is hereby incorporated herein by reference in its entirety.

TECHNICAL FIELD

The present application is directed to conflict detection in a system design and more p articularly relates to conflict detection based on a function model of the system.

BRIEF DESCRIPTION OF THE DRAWINGS

FIG. 7 illustrates a conflict table for the fuel pressure regulator of FIG. 4 consistent with embodiments disclosed herein.

FIGS. 8A and 8B illustrate a relationship table for the fuel pressure regulator of FIG. 4 consistent with embodiments disclosed herein.

FIG. 14 illustrates a screenshot of a user interface displaying a conflict table, conflict totals, a reference count Pareto list, and a conflict Pareto list for the CSS Merrimac consistent with embodiments disclosed herein.

FIG. 15 illustrates a screenshot of a user interface displaying a function model map and a function model schematic for the USS Monitor consistent with embodiments disclosed herein.

DETAILED DESCRIPTION OF PREFERRED EMBODIMENTS

Figure 1:
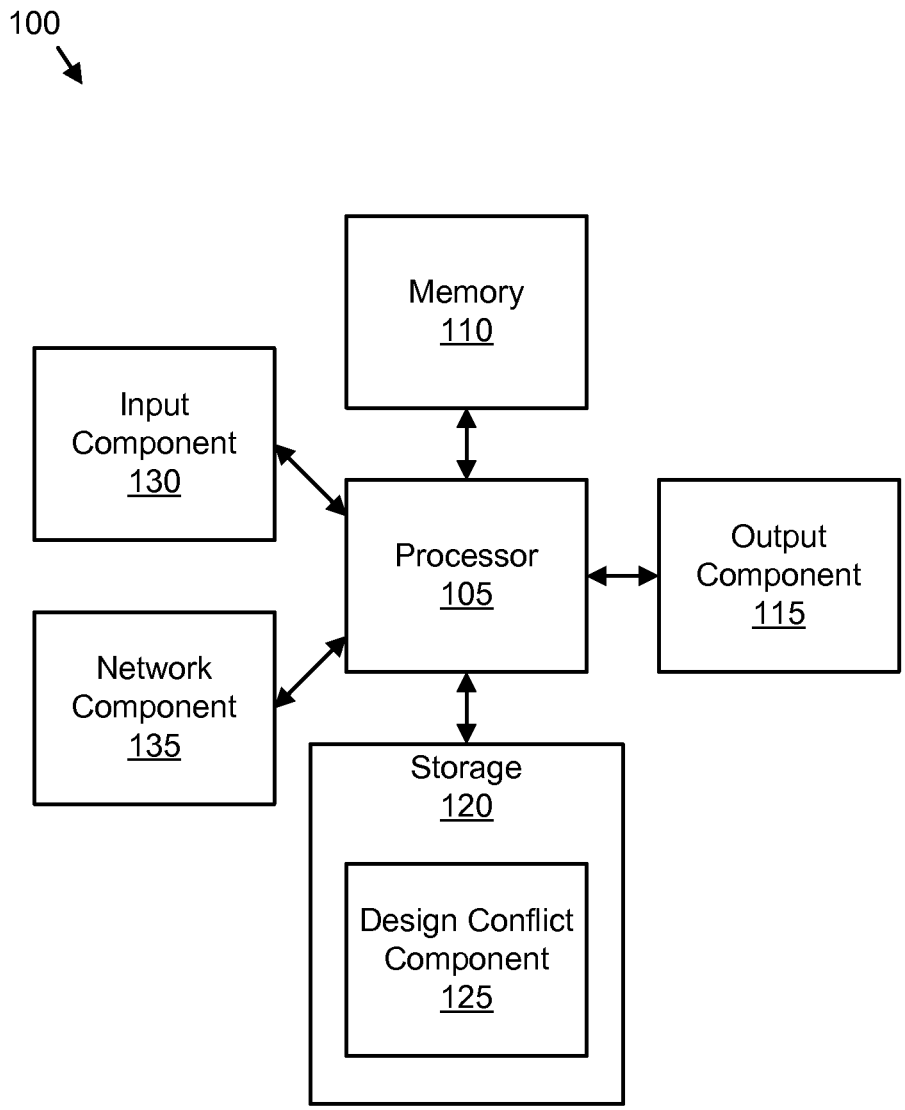
FIG. 1 is a schematic block diagram illustrating a conflict detection system detecting design conflicts in a system, product or process, consistent with embodiments disclosed herein.

Research and development for new systems, devices, or methods can be extremely expensive and time consuming. One cause of high cost and lengthened research and development periods is the perpetuation of conflicts or other problems in a design. For example, design conflicts may be introduced in the early stages of designing a system, product, or process but may not be recognized until prototypes have been built or until significant time and effort has been put into developing or testing the design.

A design conflict may be defined as an undesired relationship between parts, properties, processes, features, shapes, functions, motions etc. in a design that, if it were removed or diminished, would allow the designed system to perform better, last longer, be easier to manufacture or use, etc. One example of a design conflict in automotive electronic power steering systems is the conflict between the desire for steering feel stiff and the minimization of road noise. If stiff steering is achieved the system transmits more undesired road noise. To minimize road noise, the steering must be loose. Thus, "Stiff feeling steering" is in conflict with "minimizing road noise". Even in situations where design conflicts cannot be completely removed, understanding and recognizing potential problems or conflicts early on in the design process can lead to significantly better results and costs savings due to a reduced number of unforeseen problems arising late in a design process.

Generally, design conflicts have been identified through the skill and luck of a designer, others reviewing the design, and/or the usage of prototypes. However, there has been no guaranteed way to identify or detect design conflicts, especially early on in the design process. As engineering services are expanded into broader and more complex products and process, the designs and systems become exponentially more complex. A structured methodology is needed to insure design conflicts are detected proactively and as early as possible.

The present disclosure discuses systems and methods to accelerate the design of a system, product, or process by identifying design conflicts and potential design conflicts conceptually early on in the development process. Examples of conflict types that may be identified include requirement conflicts, potential tolerance conflicts, and other types of conflict. Such embodiments save time and costly iterations in the development process by finding and addressing design conflicts proactively and at stages where the costs of changing a design are reduced.

According to one embodiment, a method disclosed herein includes analyzing a function model created using language from a bill of material or bill of process to identify specific noun/verb relationships that could signify a design or tolerance conflict between functions or components of a product or process. Once the conflict is discovered, the changes can be made to decouple the conflicting relationships without the need for the expensive processes of building or testing product. In addition to evaluating the conflicts of a single design, there is the need to evaluate multiple competing designs to determine which design is best for the market place.

Turning now to the figures, FIG. 1 is a block diagram illustrating a conflict detection system 100 for conflict detection in a design of a system, device, or process. The conflict detection system 100 may include a variety of computing devices such as a laptop computer, desktop computer, server, tablet computer, smart phone, or other computing device. The conflict detection system 100 includes a processor 105, a memory 110, an output component 115, a storage 120 that includes a design conflict component 125, an input component 130, and a network component 135.

The processor 105 may be used to process executable code and data stored in the memory 110 and the storage 120. The memory 110 may include operating memory such as random-access memory (RAM), read-only memory (ROM) or other memory. In one embodiment, the memory 110 includes transitory memory. The storage 120 may include non-transitory memory such as a magnetic hard disk drive (HDD), a solid state drive (SSD), or the like. In one embodiment, the storage 120 includes a design conflict component 125. The design conflict component 125 may include executable code and/or other data that can be processed by the processor 105. The design conflict component 125 may be used to detect design conflicts in a system, product, process or other conceptual design. Although the design conflict component 125 is depicted as residing within the storage 102, other embodiments may include design conflict components 125 that are embodied separately from the storage 102 and/or in hardware. The design conflict component 125 will be discussed further in relation to the remaining figures.

The processor may provide output to an output component 115 to display information on a display screen or other output device. The input component 130 may receive input from an input device such as a keyboard, mouse, touch-screen or the like to allow a user to provide input to the conflict detection system 100. The network component 135 may allow the conflict detection system 100 to communicate with another device or system.

Figure 2:
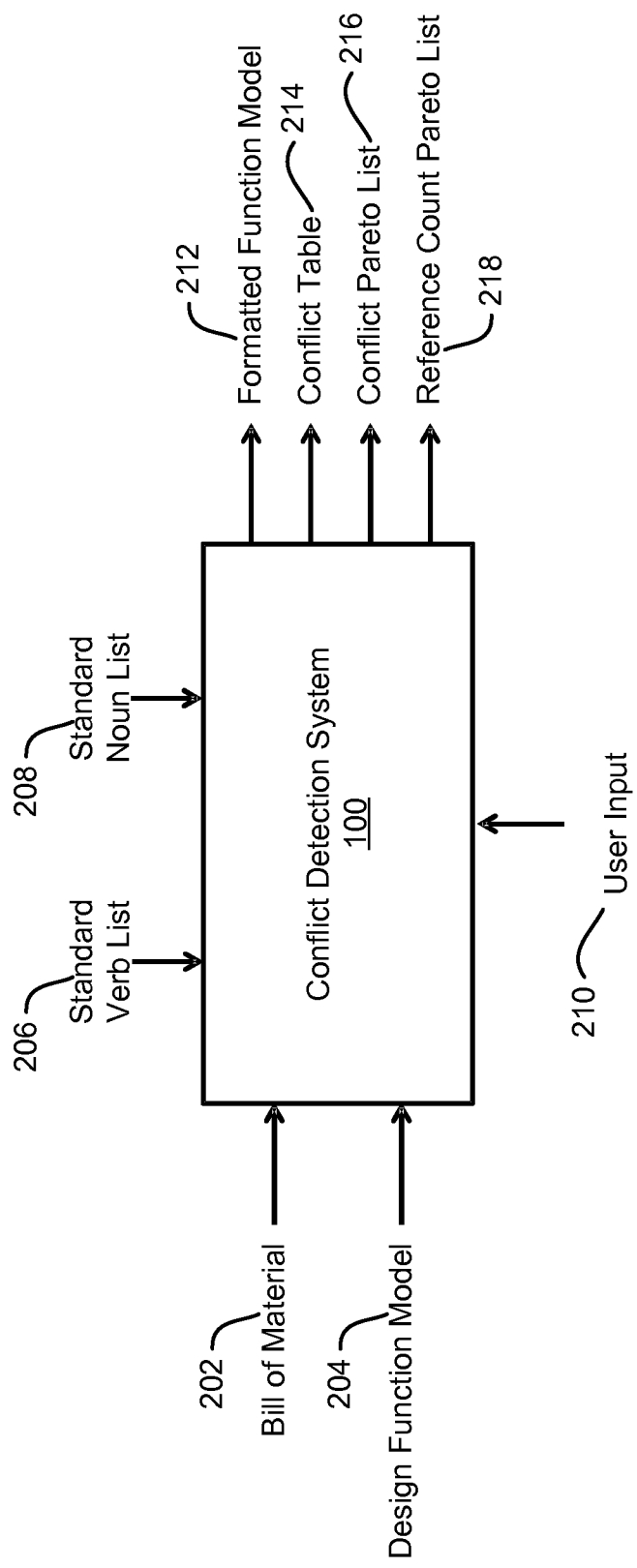
FIG. 2 is a schematic block diagram illustrating inputs, reference information, and outputs of the conflict detection system, consistent with embodiments disclosed herein.

FIG. 2 is a block diagram illustrating example inputs, reference information, and outputs of the conflict detection system 100. The inputs include a bill of material 202, a design function model 204, and any user input 210. The bill of material 202 includes a list of components that make up a system, process or product. The term bill of material is given to include any list of materials or components that make up a system, process, or product. For example, a bill of material may include all the components and materials needed to manufacture, assemble, or create a product. The term bill of material is also used herein to include a bill of process that describes a process for how a product or system is assembled. Similarly, the term bill of material may be used to reference a list of components, steps, or functions that make up a process. The bill of material 202 may include design component names for each entry in the bill of material. The design component names may uniquely reference each part of the system, product, or process and/or the tools used to manufacture or assemble a system or product.

Figure 4:
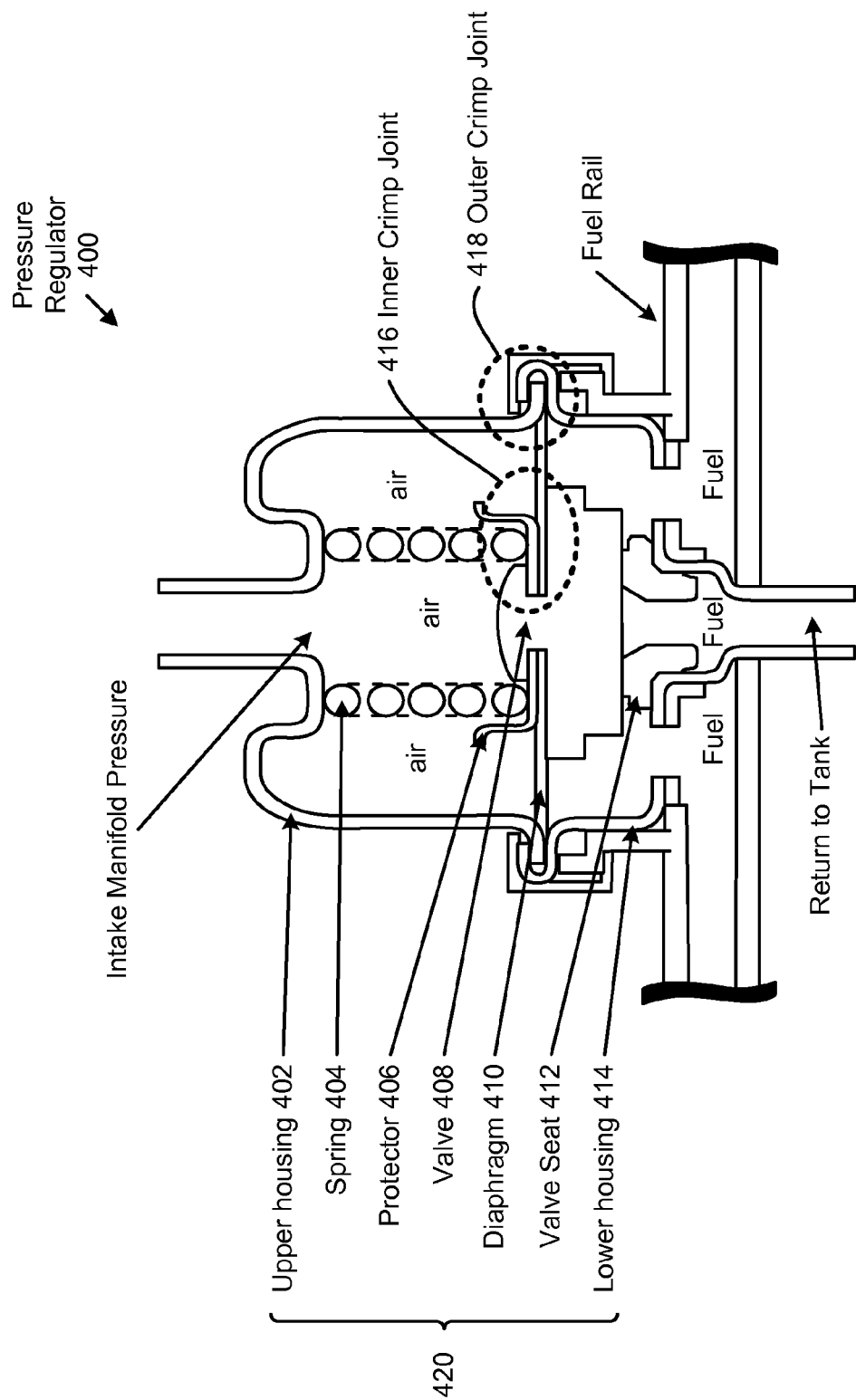
FIG. 4 is a cross sectional view illustrating a fuel pressure regulator with associated design component names consistent with embodiments disclosed herein.

FIG. 4 illustrates a cross sectional view of a fuel pressure regulator 400 and associated design component names 420 from a bill of material 202 for the fuel pressure regulator 400. The fuel pressure regulator 400 includes an upper housing 402, a spring 404, a protector, 406, a valve 408, a diaphragm 410, a valve seat 412, and a lower housing 414. In one embodiment, each of the components 402, 404, 406, 408, 410, 412, and 414 of the fuel pressure regulator 400 are listed by name on a corresponding bill of materials. Similarly, any parts or portions formed from the components 402, 404, 406, 408, 410, 412, and 414 may also be included on the bill of material, or in a corresponding bill of process. For example, a peen tool used to form a part may also be listed on the bill of material or bill of process. Similarly, features formed during the assembly process or that are part of the materials may also be listed in the bill of process or bill of materials. For example, the inner crimp joint 416 and/or the outer crimp joint 418 may be listed on the bill of material or bill of process as well.

A design function model 204 is a representation of the functions of parts or components of a system, device, or process. The design function model 204 includes descriptions of at least some of the functions to be performed by the system, product or process and is structured to identify dependencies between the different functions. In one embodiment, the design function model 204 includes a structure that describes how, why, and when respective functions are performed. For example, descriptions of functions that are performed for a specific purpose may depend from a description of the specific purpose. In one embodiment, design function models 204 may be graphically displayed with descriptions at nodes with the location of the node and connectors between nodes indicating dependencies between the nodes.

FIGS. 5A through 5G illustrate one embodiment of a function model 500 for the fuel pressure regulator 400. Due to its size the function model 500 is spread over multiple pages. The function model 500 includes descriptions of functions for preventing fuel leaks from the fuel pressure regulator 400 of FIG. 4. In order to contain the fuel, the design requires a maximized inner and outer joint compression. At the same time to avoid damaging the diaphragm, the design requires minimized inner joint compression.

The descriptions of functions of the function model 500 are organized to identify dependencies between functions. For example, descriptions at parent nodes correspond to functions that are stated more broadly and in relation to a purpose of a function while child nodes are stated more specifically and in relation to how a specific purpose or function is achieved (e.g. parent notes indicate why and child nodes indicate how). Specifically, the functions "Contain Fuel at Inner Crimp Joint", "Prevent Diaphragm Permeation", "Contain Fuel at Outer Crimp Joint", and "Prevent Lower Housing Wall Breach" are all specific descriptions of functions to achieve the broader function of "Prevent Fuel Leaks" (see FIG. 5A).

Figure 5A:
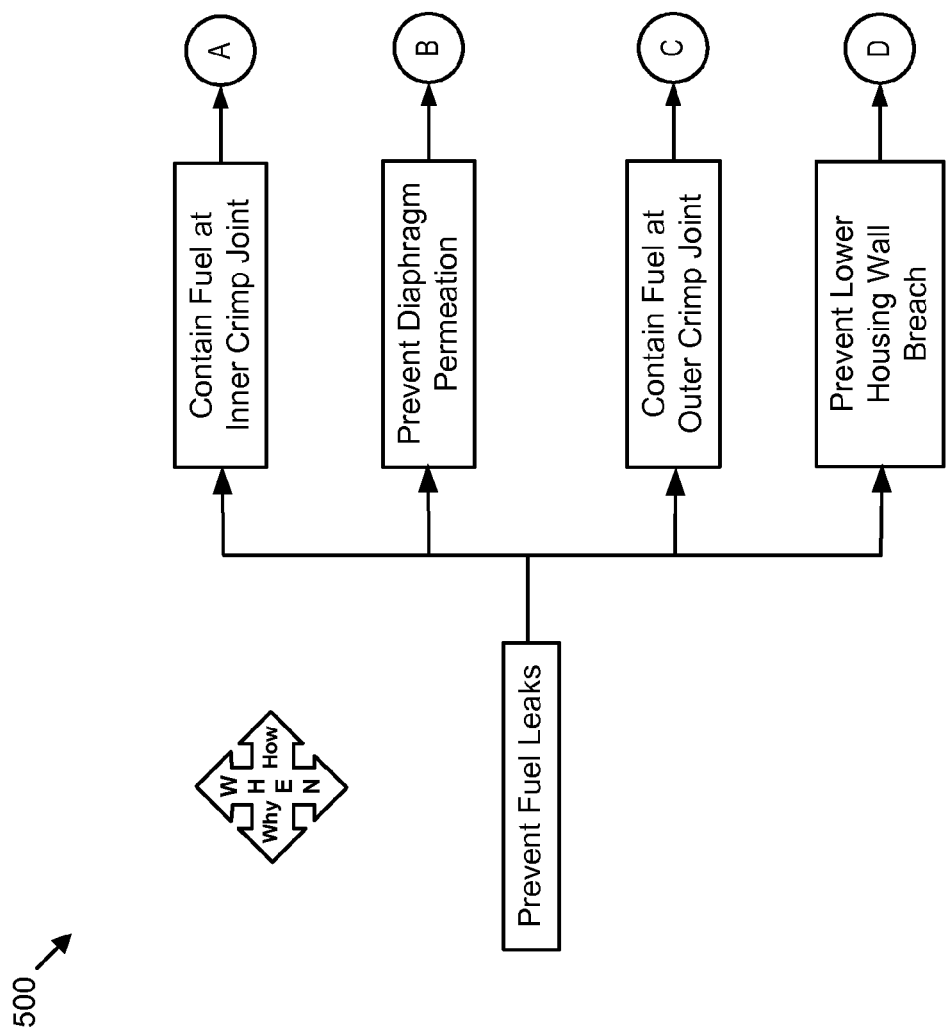
FIG. 5A through 5G are schematic block diagrams illustrating a function model of the fuel pressure regulator of FIG. 4 consistent with embodiments disclosed herein.
Figure 5B:
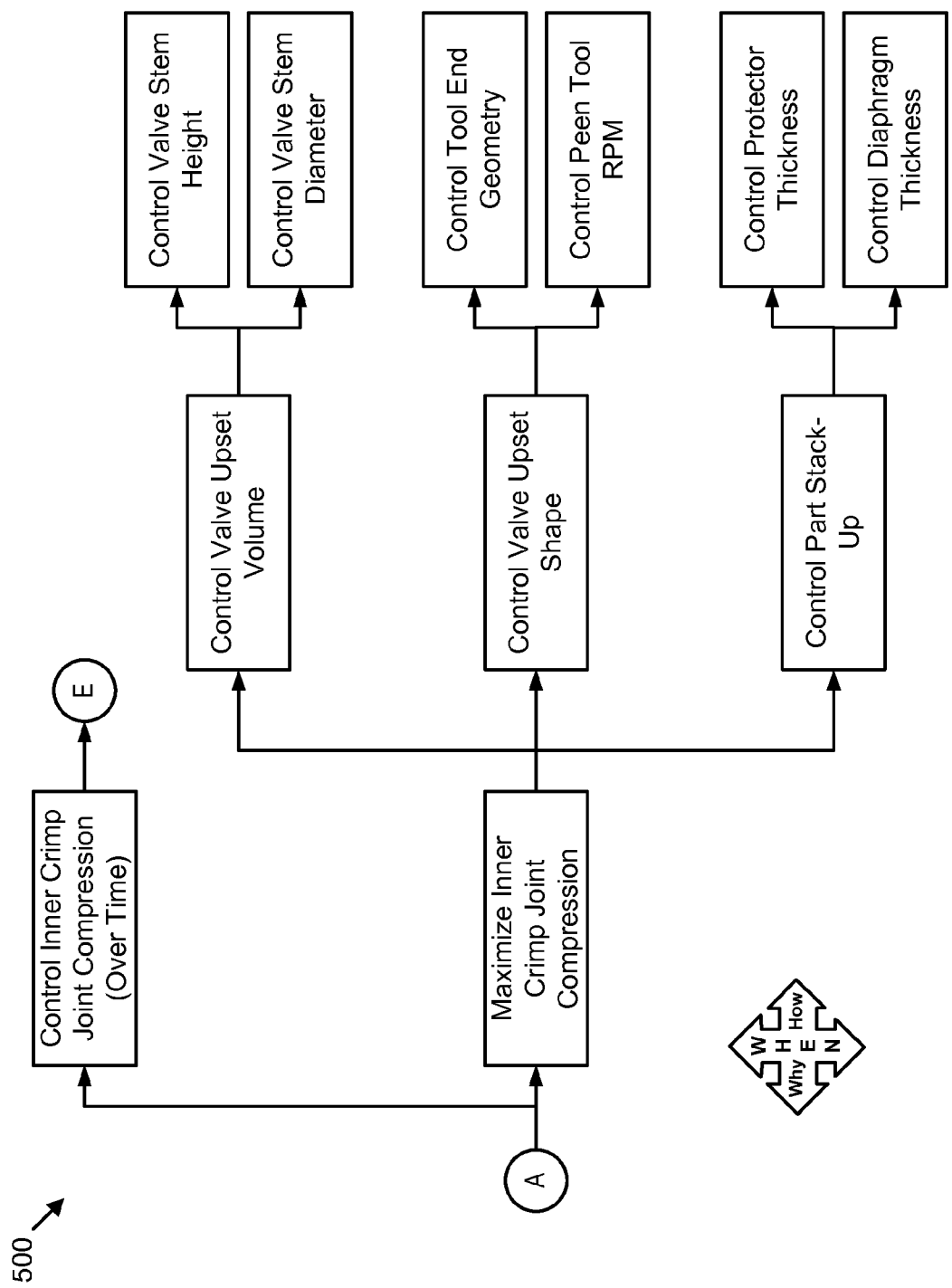
Figure 5C:
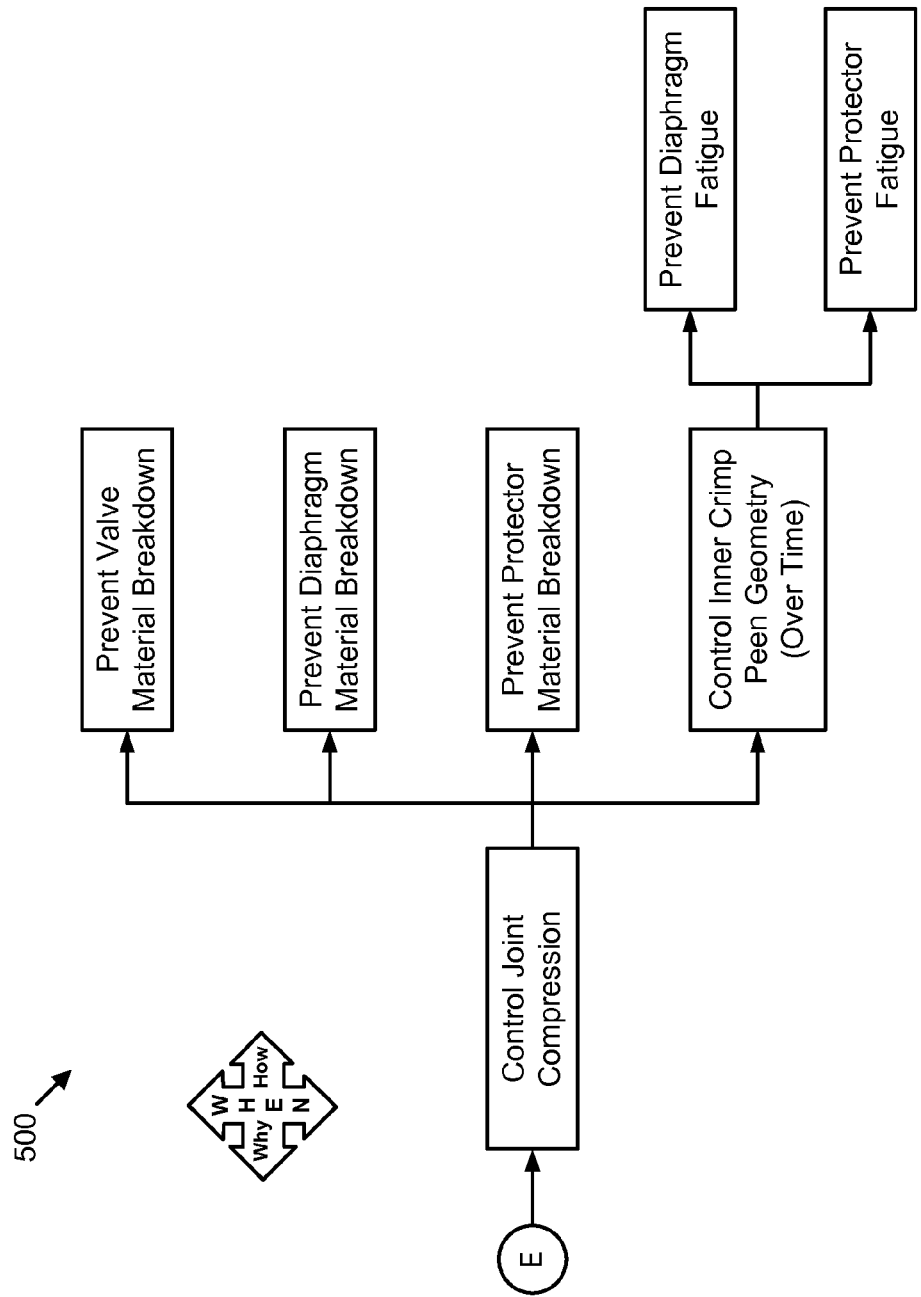
Figure 5D:
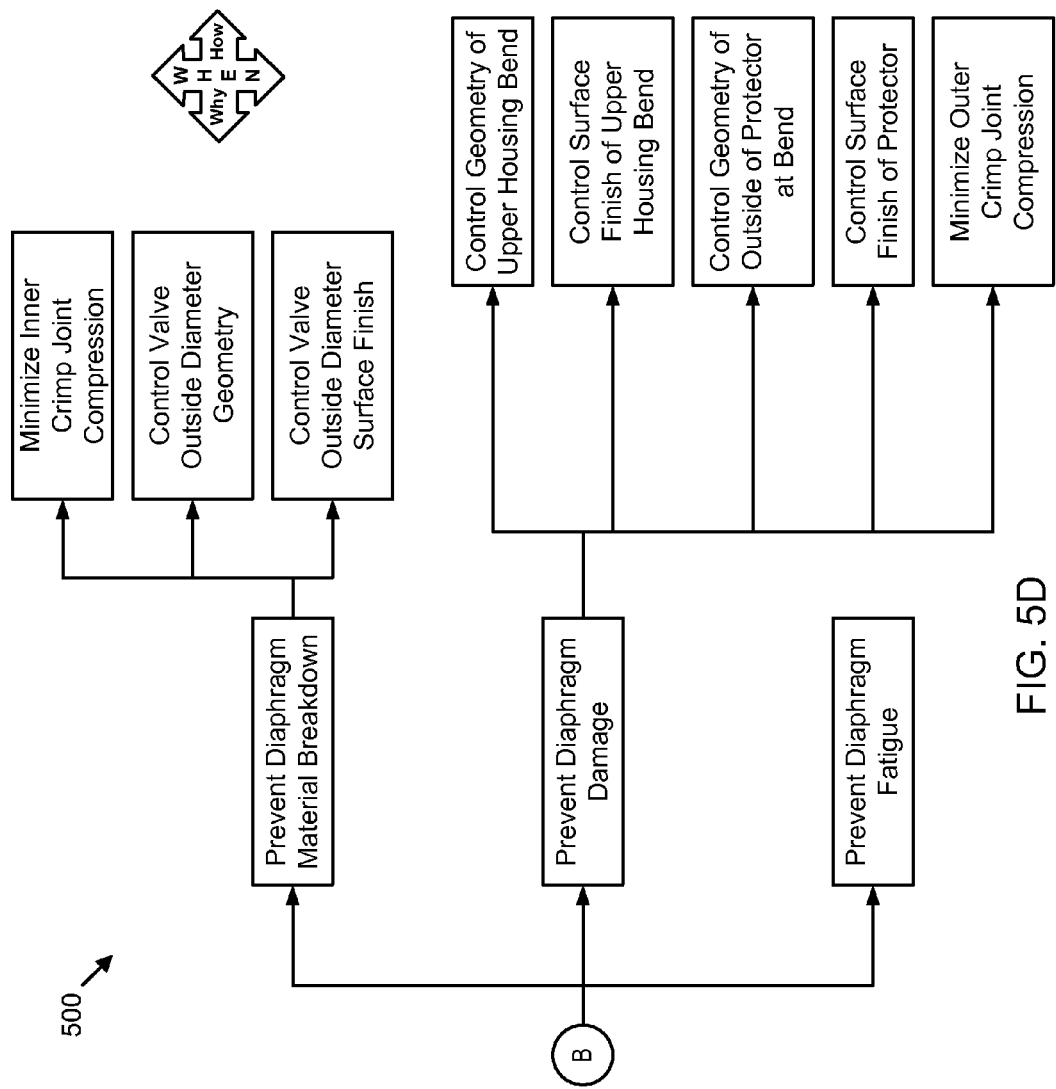
Figure 5E:
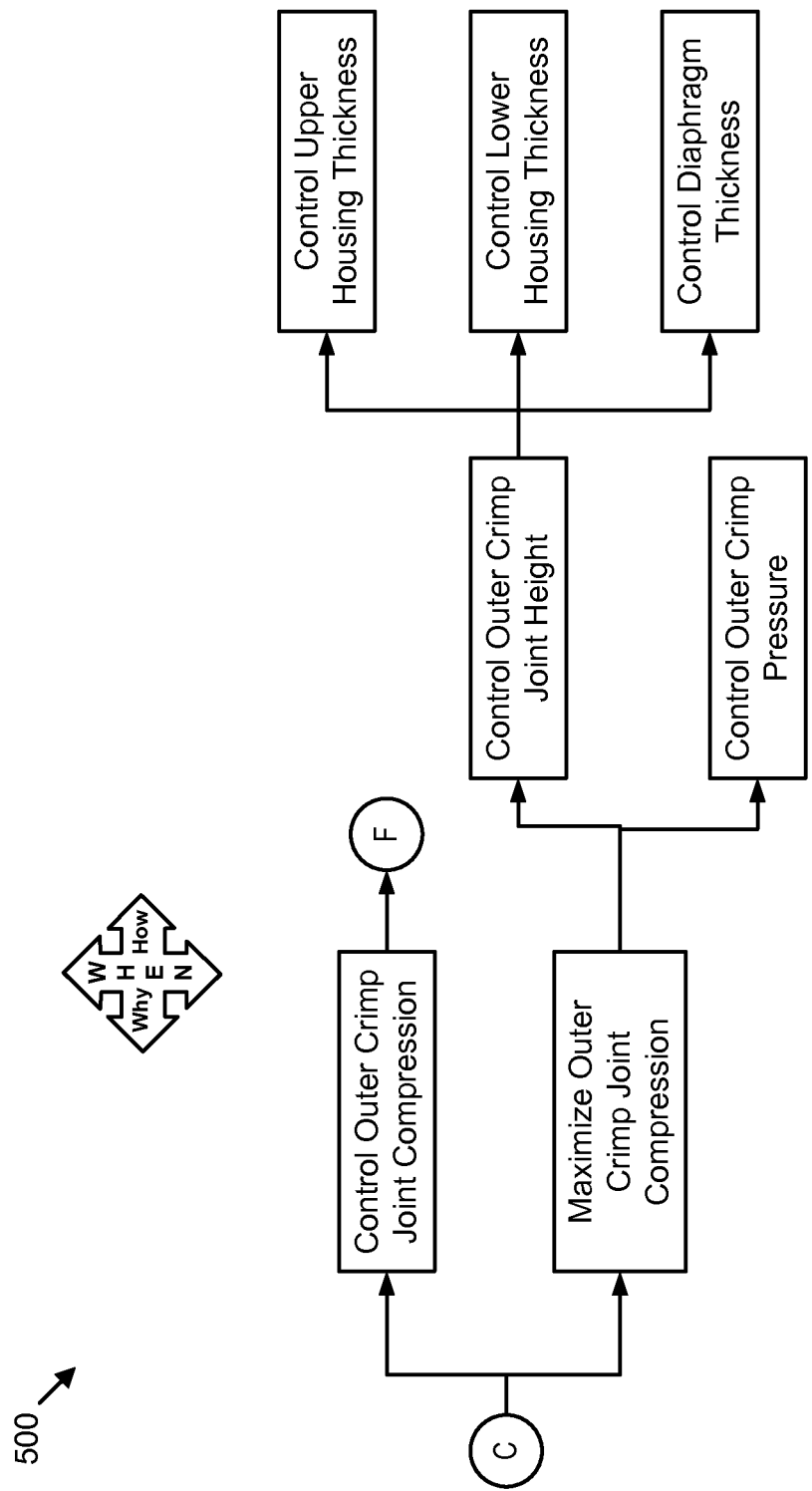
Figure 5F:
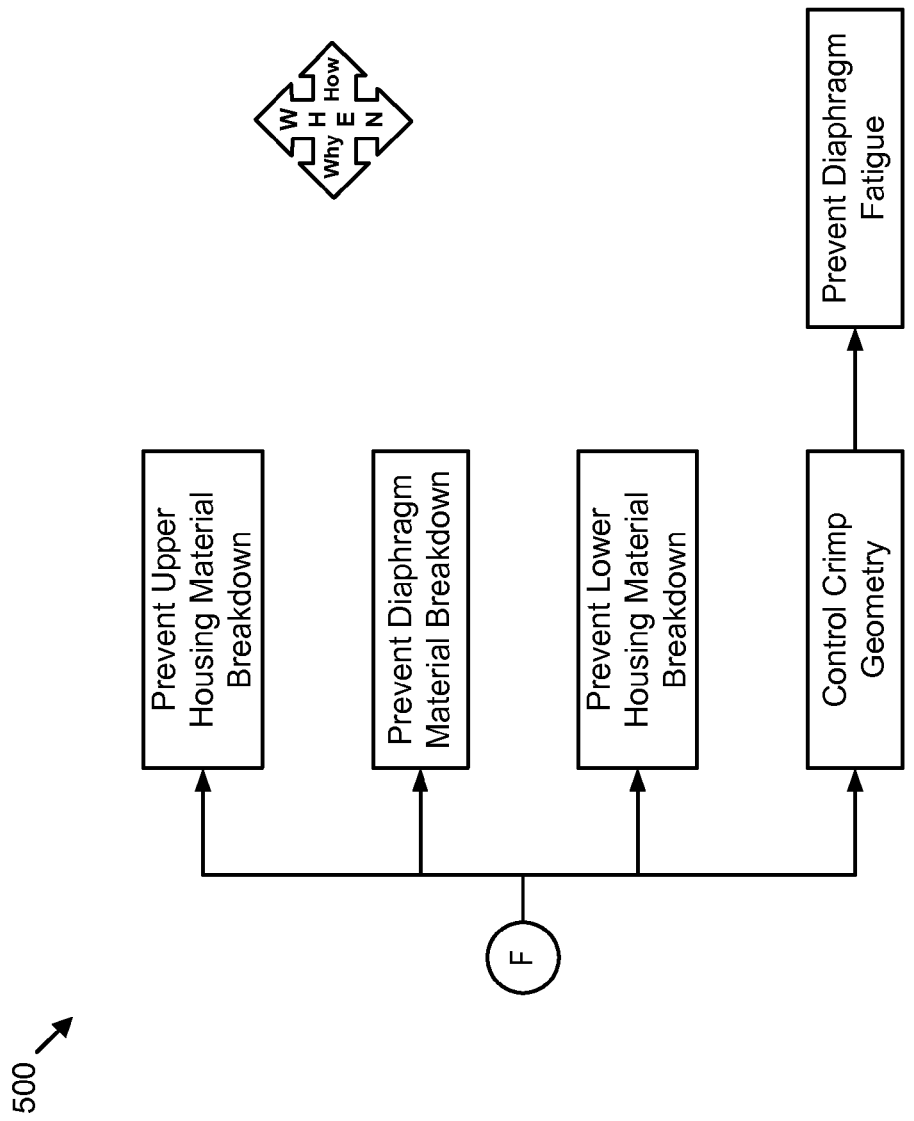
Figure 5G:
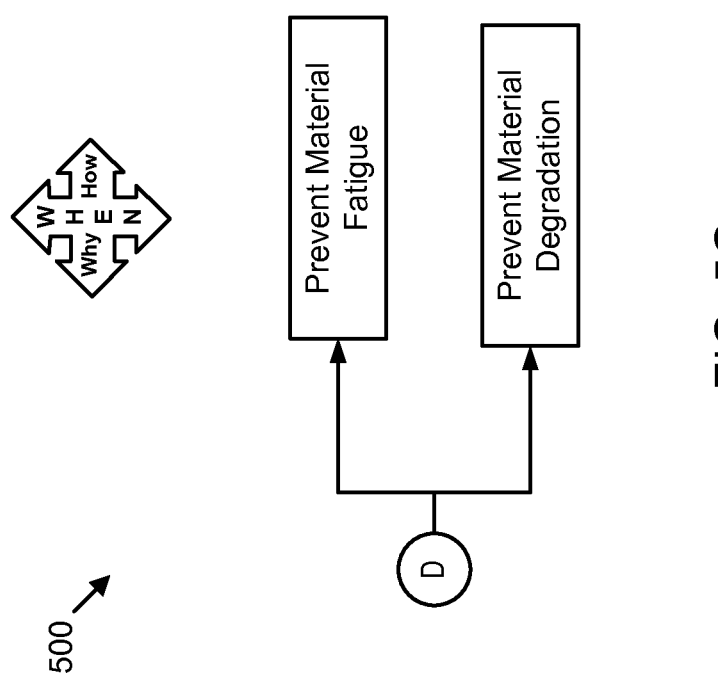

FIGS. 5B and 5C include specific functions and purposes to accomplish the broader "Contain Fuel at Inner Crimp Joint" function of FIG. 5A. FIG. 5D includes specific functions and purposes to accomplish the broader "Prevent Diaphragm Permeation" function of FIG. 5A. FIGS. 5E and 5F include functions and purposes to accomplish the broader "Contain Fuel at Outer Crimp Joint" function of FIG. 5A. FIG. 5G includes specific functions and purposes to accomplish the broader "Prevent Lower Housing Wall Breach" function of FIG. 5A. These relationships and dependencies are indicated, in the depicted embodiment, by the position of a function with respect to other functions and by connectors between functions. For example, functions farther to the left (higher up in the hierarchy) are broader descriptions of why dependent functions to the right are performed. Functions farther to the right (lower down in the hierarchy) are more specific descriptions of how the parent functions to the left are accomplished.

Although the function model 500 of FIGS. 5A through 5G is illustrated as a schematic, information corresponding to the function model 500 may be stored in a variety of formats within a file, database, or other storage structure which can be input into the conflict detection system 100.

The user input 210 may be input from a user to select a bill of material 202, design function model 204, standard verb list 206, and/or standard noun list 208 to be used by the conflict detection system 100 in detecting conflicts. A user may also be able to provide input to initiate conflict detection, save results, modify a function model or bill of materials, or the like.

The reference information for the conflict detection system 100 includes a standard verb list 206 and/or a standard noun list 208. The standard verb list 206 and/or the standard noun list 208 may include terms that are recognized as active verbs or descriptive nouns, respectively. For example, the conflict detection system 100 may use the lists 206, 208 to identify active verbs or descriptive nouns within a description of the design function model 204.

The conflict detection system 100, according to the depicted embodiment, outputs a formatted function model 212, a conflict table 214, a conflict Pareto list 216, and a reference count Pareto list 218. Each of the outputs 212, 214, 216, 218 may be outputted in a file format, visually on a display, or in any other manner. The formatted function model 212 may be a modified version of the design function model 204. In one embodiment, the conflict detection system 100 modifies the design function model 204 to include design component names from the bill of material 202, terms from the standard verb list 206, and/or terms from the standard noun list 208. For example, the conflict detection system 100 may modify the function model 500 of FIGS. 5A through 5G to include design component names 420 from a bill of materials. Similarly, the conflict detection system 100 may display the formatted function model 212 in a variety of different configurations, such as a function model map configuration or function model schematic configuration (see e.g. FIG. 6).

Figure 10:
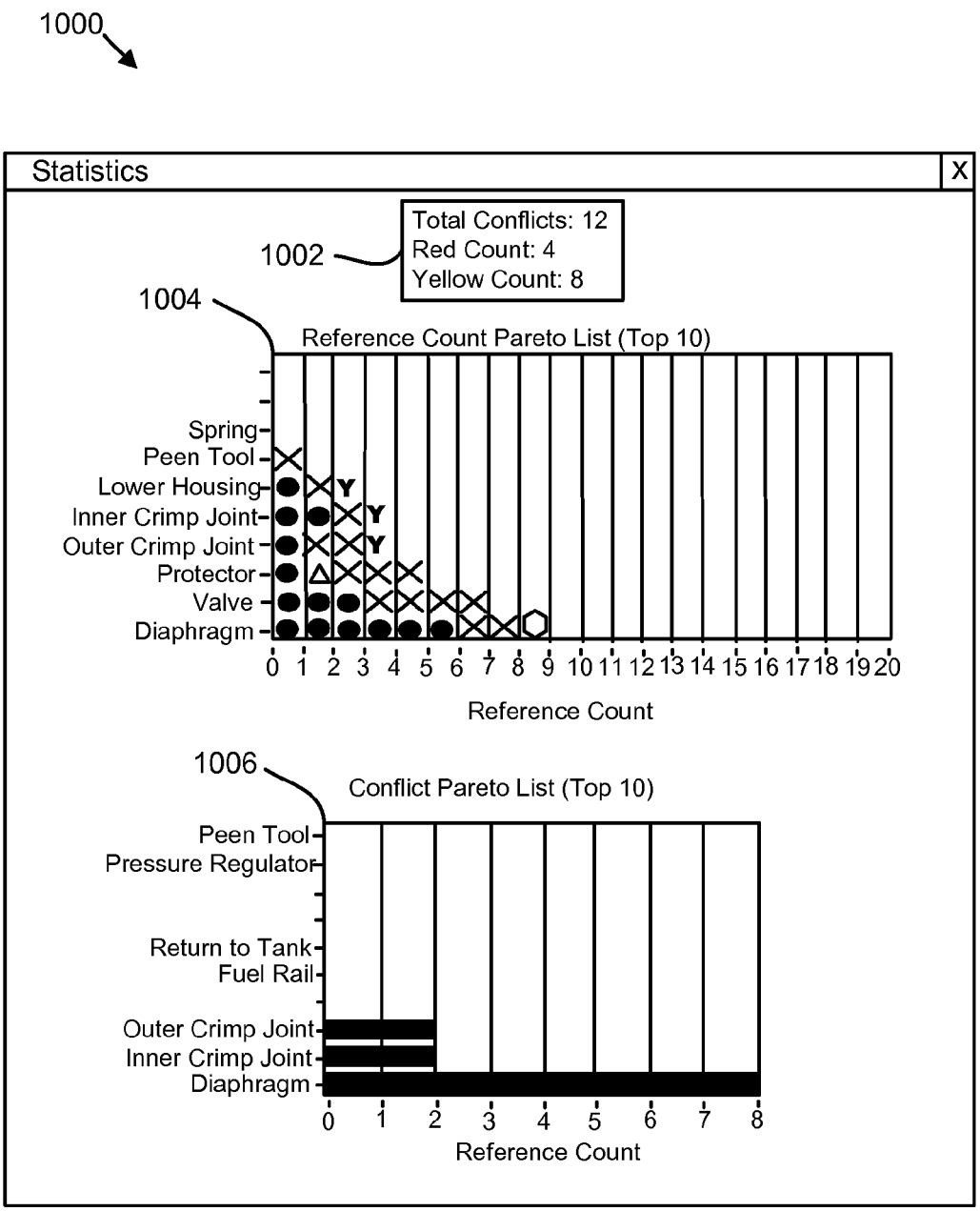
FIG. 10 illustrates a screenshot of a statistics window consistent with embodiments disclosed herein.

The conflict table 214 may include a table that includes descriptions from the design function model 204 and information regarding any conflicts between the descriptions. FIG. 7 illustrates one embodiment of a conflict table 214. The conflict Pareto list 216 may include a ranked list of design component names that are ranked based on a number of conflicts corresponding to each design component name. FIG. 10 illustrates one embodiment of a conflict Pareto list 1006. The reference count Pareto list may include a ranked list of design component names based on a number of times a design component name was referenced in descriptions within the design function model 204. FIG. 10 illustrates one embodiment of a reference count Pareto list 1004.

Figure 3:
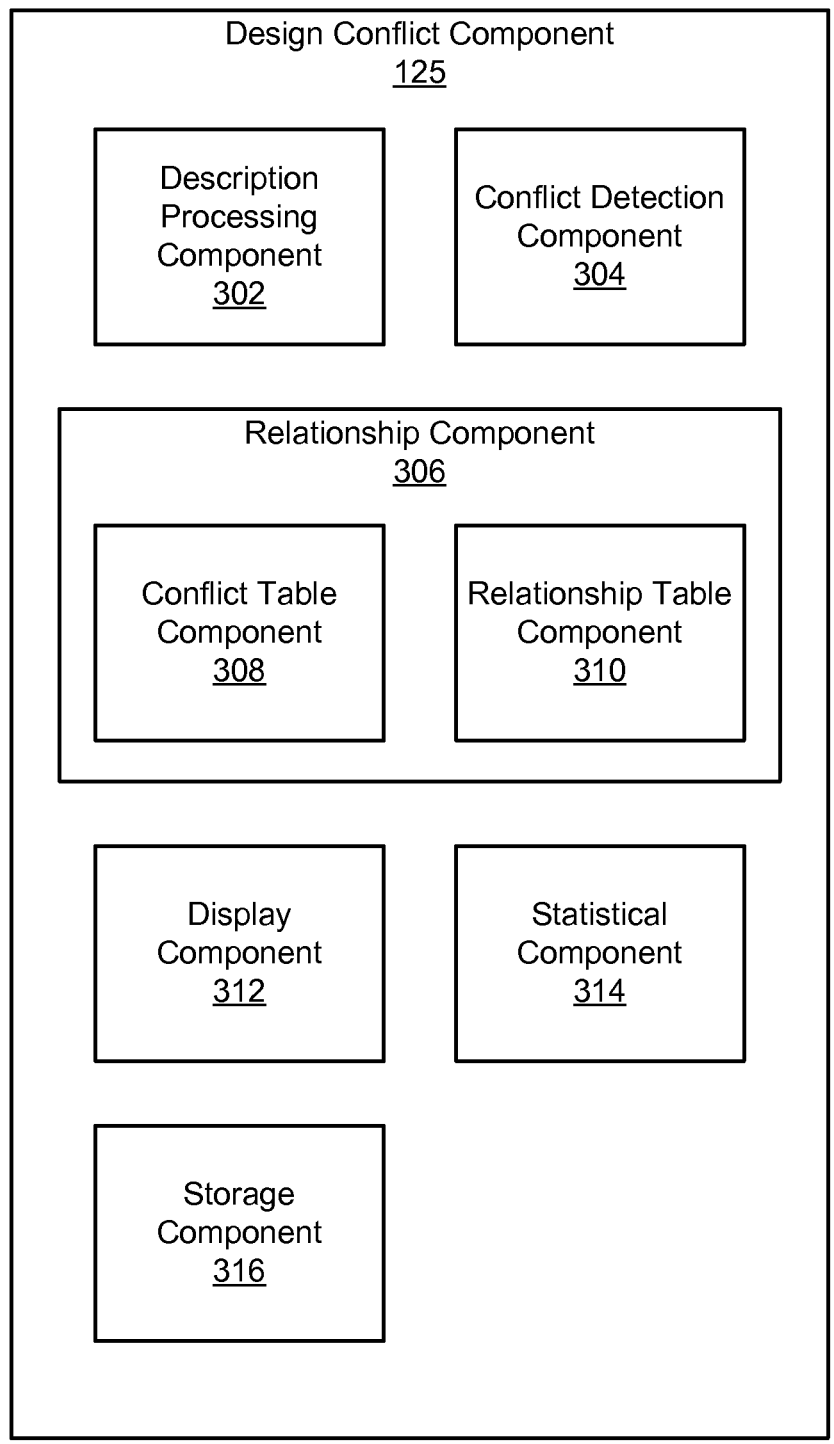
FIG. 3 is a schematic block diagram illustrating components of a design conflict component consistent with embodiments disclosed herein.

FIG. 3 is a block diagram illustrating example components of a design conflict component 125. The design conflict component 125, according to the depicted embodiment, includes a description processing component 302, a conflict detection component 304, a relationship component 306 that includes a conflict table component 308 and a relationship table component 310, a display component 312, a statistical component 314, and a storage component 316.

The description processing component 302 processes a function model of a system, product or process to identify descriptions of functions of the system, product, or process or functions of parts or components of the system, product, or process. For example, the description processing component 302 may process the function model 500 of FIG. 5 to identify descriptions of functions within the function model 500. The description processing component 302 may identify descriptions based on a format of the data structure, by processing text within the function model to identify separate functions, or the like.

The description processing component 302 may process the function model in preparation for processing by other components of the design conflict component 125. For example, the description processing component 302 may parse the function model into a number of different descriptions that can then be processed by other components. In one embodiment, the description processing component 302 parses each description into separate parts. For example, the description processing component 302 may parse each description into a design component name, an active verb, and a descriptive noun. The description processing component 302 may search each description for a term from one or more of the bill of material 202, the standard verb list 206, and the standard noun list 208 to locate any design component names, active verbs, or descriptive nouns in the description.

In one embodiment, the description processing component 302 identifies descriptions of the function model and places them within an alternate format, such as a table format, a function map format, a graphical format, or any other graphical structure or data structure. For example, the description processing component 302 may parse the function model into separate descriptions and/or parse the descriptions into separate terms. These parsed versions of the function model and/or descriptions may then be processed by the conflict detection component 304, relationship component 306, or other components.

Figure 6:
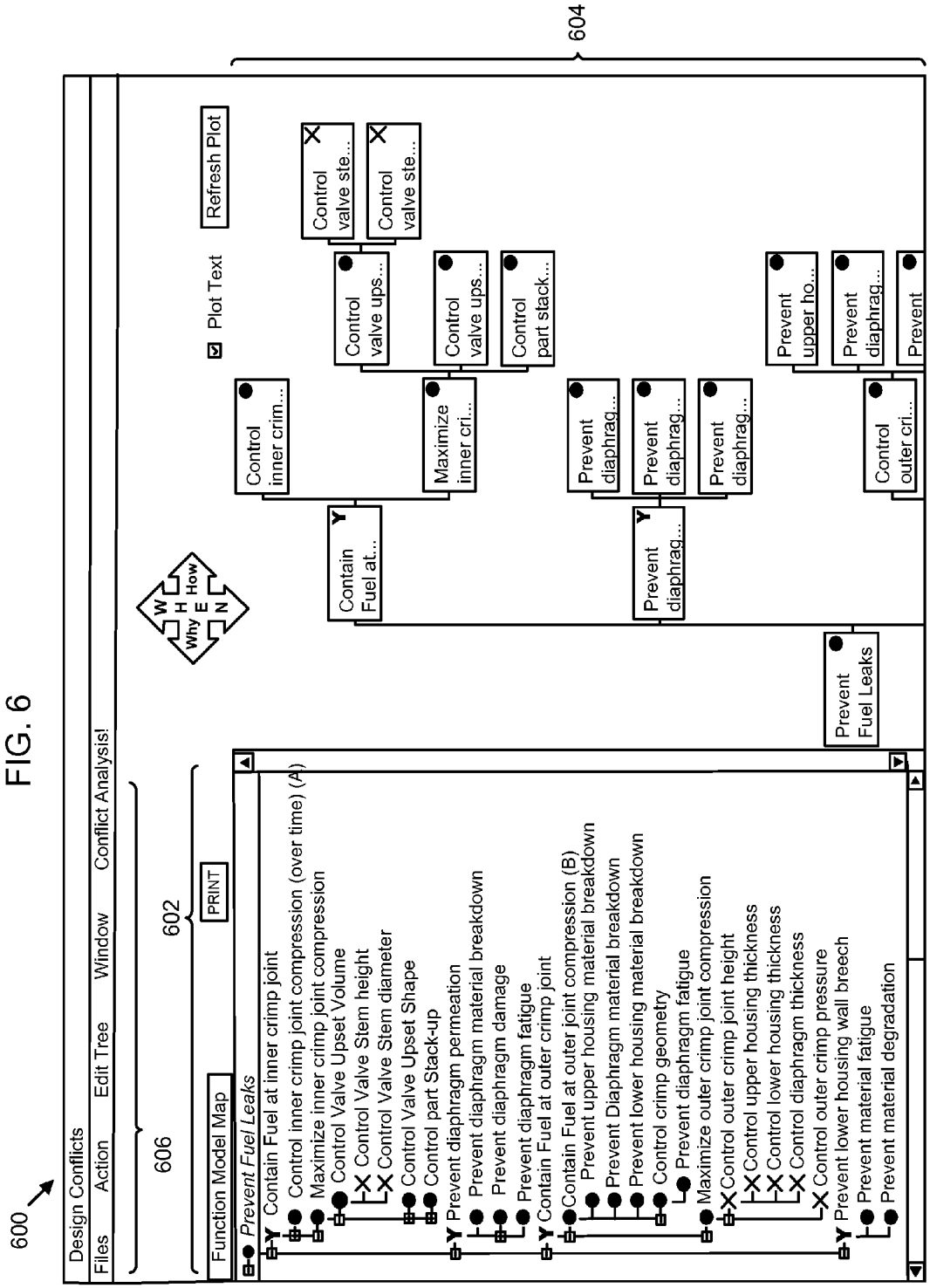
FIG. 6 illustrates a screenshot of a user interface displaying a function model map and a function model schematic prior to conflict detection consistent with embodiments disclosed herein.

FIG. 6 illustrates a user interface 600 with a function model map 602 and a function model schematic 604. According to one embodiment, the description processing component 302 may process the function model to create a reformatted version of the function model as a function model map 602 format and/or a function model schematic 604 format.

FIG. 7 illustrates a conflict table 700. According to one embodiment, the description processing component 302 may partially fill out the conflict table 700. For example, the description processing component 302 may process the function model and insert data into the "Description", "Tally", "Index", "Verb", and "Noun" columns. This may result in a partially filled out conflict table 700 which can then be processed by other components, such as the conflict detection component 304 and the relationship component 306, to detect and flag conflicts.

FIGS. 8A and 8B illustrate one embodiment of a relationship table 800. According to one embodiment, the description processing component 302 may partially fill out the relationship table 800. For example, the description processing component 302 may process the function model and insert data into the "Description" column and create the "Upper Housing", "Spring", "Protector", "Valve Seat", "Diaphragm", "Lower Housing", "Inner Crimp Joint", "Outer Crimp Joint" component name headings based on design component names found in a bill of material 202, bill of process, or a function model. This may result in a partially filled out relationship table 800 which can then be processed by other components, such as the conflict detection component 304, the relationship component 306, and the statistical component 314 to detect and flag conflicts and other relationships or conflicts in the function model.

Returning to FIG. 3, the conflict detection component 304 detects conflicts based on whether the descriptive nouns, active verbs and design component names match between descriptions. For example, the conflict detection component 304 may compare each of the descriptions with each other to determine whether or not there are matching terms between the description. The conflict detection component 304 may then determine that there is a conflict between two specific descriptions based on how the terms match.

In one embodiment, the conflict detection component 304 may detect conflicts between function descriptions based on patterns of how the design component names, active verbs, and descriptive nouns match or do not match. In one embodiment, for example, the conflict detection component 304 may detect a requirement conflict by detecting a first description that has a design component name and descriptive noun that match with a second description but includes an active verb that does not match the second description. In other words, the design component name and descriptive noun match between the descriptions but the active verb does not.

Descriptions with matching design component names and descriptive nouns and non-matching active verbs constitute a requirement conflict because functions are being asked to perform different actions (active verb) with respect to the same aspect of the system, product, or process (such as a design component name and/or a descriptive noun). For example, rows 30 and 39 of the conflict table 700 of FIG. 7 illustrate descriptions that constitute a requirement conflict with each other. Row 30 of the conflict table 700 includes the description "Minimize outer crimp joint compression" and row 39 of the conflict table 700 includes the description "Maximize outer crimp joint compression." The conflict detection component 304 may compare each part of these descriptions and determine that the design component names ("outer crimp joint") in the "Bill of Material" column match, that the descriptive nouns ("compression") in the "Noun" column match, and that the active verbs ("minimize and maximize") do not match.

In one embodiment, the conflict detection component 304 may detect a potential tolerance conflict by detecting a first description that has a design component name, a descriptive noun, and an active verb that match a second description. Matching design component names, descriptive nouns, and active verbs constitute a potential tolerance conflict because a function and/or design component is being asked to perform the same function for perhaps a different purpose. One of the purposes may require a first value or performance of the function while another purpose may require a different value or performance. Thus, there may be a tolerance problem in that the tolerances for the two different functions may conflict. As an example, rows 31 and 38 of the conflict table 700 of FIG. 7 constitute a potential tolerance conflict. Both rows 31 and 38 include the description "Prevent diaphragm fatigue." Although they include the same description, the functions may have different ranges or tolerances for how fatigue is prevented.

Detection of tolerance conflicts allows a user, such as a trained engineer, to evaluate a potential tolerance conflict and determine if there is indeed a conflict or if the tolerances match. In some cases, even if the tolerances match, it may be desirable to decouple the potential tolerance conflict because it may be desirable to adjust tolerances later. If there is a potential tolerance conflict there may be a reduced possibility of adjustment because there may be a smaller range for values or performance to meet requirements.

In addition to detecting conflicts or potential conflicts, the conflict detection component 304 may detect errors in the descriptions or function model. In one embodiment, the conflict detection component 304 detects descriptions that do not comprise a design component name (e.g., bill of material name for a component of the system, product, or process). The conflict detection component 304 may detect the absence of a design component name by comparing a description with items or nouns in the bill of materials 202, or other similar list of design component names. For example, if a description does not include at least one design component name from the bill of materials 202 the conflict detection component 304 may determine that there is no design component name in that description. This may be the case if there is a typo when entering a description, if a variation on a name for a component is used, or if the component name is left out.

The conflict detection component 304 may also detect descriptions that do not include one or both of a descriptive noun and an active verb. The conflict detection component 304 may detect the absence of a descriptive noun or active verb by comparing a description with the standard verb list 206 and/or the standard noun list 208. For example, if a description does not include any of the terms found in either the standard verb list 206 or the standard noun list 208, the conflict detection component 304 may determine that there is an error.

Missing design component names, descriptive nouns, and/or active verbs can result from a variety of errors such as typos, using alternate terms in place of a standard term or bill of materials 202 term, or the like. These can be very difficult to detect because the errors may be slight or the terms may have similar meanings. Thus, they may be difficult for a human to recognize. By the conflict detection component 304 detecting these errors a user can be notified of the error and fix it. After fixing, another check for conflicts may turn up more conflicts or may more accurately reflect the conflicts or potential conflicts that exist for the design of the system, product, or process.

The conflict detection component 304 may detect conflicts and/or errors by processing descriptions and/or data structures created or modified by the description processing component 302. For example, the conflict detection component 304 may process a reformatted function model, such as the function model map 602 or the function model schematic 604 of FIG. 6, the conflict table 700 of FIG. 7, or the relationship table 800 of FIGS. 8A and 8B. In one embodiment, the description processing component 302 may fill out the "Description," "Tally," "Index," "Verb," "Noun," and "Bill of Material" columns of the conflict table 700, and the conflict detection component 304 may compare the active verbs, descriptive nouns, and design component names between different descriptions based on how the description processing component 302 fills out the conflict table 700. For example, the conflict detection component 304 may compare the term at row 30 of the "Verb" column to the terms at other rows to see if they match.

The relationship component 306 may track information regarding descriptions and relationships between the descriptions. The relationship component 306 may track conflicts, errors, the use of terms, and/or other aspects of the descriptions. For example, the relationship component may record information indicating the existence of a conflict or error based on the conflict detection component 304 detecting conflicts or errors. The relationship component 306 may also detect other types of relationships or perform other types of analysis on descriptions or function models to detect other information that may be of use to designers.

In one embodiment, the relationship component 306 flags a relationship between two different descriptions as having a requirement conflict. For example, relationship component 306 may record information in a conflict table 700, relationship table 800, function model map 602, or function model schematic 604 in response to the conflict detection component 304 detecting a conflict. In one embodiment, the relationship component 306 may flag relationships as different conflict, error, or other types based on the conflict, error, or other type detected by the conflict detection component 304. Specific examples of flagging or tracking conflicts, errors, or other information regarding descriptions will be discussed further in relation to the conflict table component 308 and the relationship table component 310.

The conflict table component 308 manages a conflict table, such as the conflict table 700 of FIG. 7. The conflict table component 308 may modify the conflict table 700 based on instructions or information provided by other components, such as the description processing component 302 and the conflict detection component 304. For example, the conflict table component 308 modifies values and or/an appearance of cells of the conflict table 700 in response to the conflict detection component 304 detecting a conflict or the description processing component 302 identifying a description. For example the conflict table component 308 may maintain conflict total information 702 for the current conflict table 700.

Returning to FIG. 7, an example conflict table 700 is shown. The conflict table 700 includes a plurality of cells organized into rows and columns. The rows each correspond to a description from the function model 500 of FIGS. 5A through 5G. Not all the rows are visible so not all of the descriptions are shown in FIG. 7. The columns include a "Description" column, a "Tally" column, an "Index" column, a "Verb" column, a "Noun" column, a "Bill of Material" column, a "C1" column, a "C2" column, and a "C3" column. Additional or fewer columns may be included in some embodiments.

The "Description" column includes descriptions from a design function model 204 as processed by the description processing component 302. The "Tally" column includes a ranking identifier indicating a hierarchical level of the description. For example, each description may be anywhere between a root node and a leaf node that is organized from broadest at the root node to most specific at the leaf node. A "Y" indicator may indicate a higher level desired result, a circle may indicate a middle level desired result that needs to be accomplished to accomplish a parent function, and an "X" indicator may indicate a lower level input or function to accomplish the higher level functions or purposes. The "Index" column includes an index number for the corresponding row and description. The value within the "Index" column may be used to reference the specific description or row.

The "Verb" column includes a term from the description that corresponds to an active verb, such as a term from the standard verb list 206, for each description. In one embodiment, if no active verb is detected, the cell in the "Verb" column for a corresponding description is left blank. The "Noun" column includes a term from the description that corresponds to a descriptive noun, such as a term from the standard noun list 208. In one embodiment, if no descriptive noun is detected, the cell in the "Noun" column for a corresponding description is left blank. For example, the cell corresponding to row 32 and column "Noun" is shown blank. The "Bill of Material" column includes a term from the description that corresponds to a design component name, such as a name from a bill of material 202. In one embodiment, if no design component name is detected, the cell in the "Bill of Material" column for a corresponding description is left blank. For example, the cells corresponding to rows 33 and 37 of the "Bill of Material" is shown blank.

The columns "C1", "C2", and "C3" include index values for descriptions that conflict or may conflict with the description of the corresponding row. For example, row 30 includes the index value "39" in column "C1" to indicate that the description of row 30 has a conflict with the description of row 39. If a second or third conflict or potential conflict were detected, the columns "C2" and/or "C3" may then be populated with the index of the conflicting description.

In addition to populating cells within the conflict table to flag conflicts or other errors, the conflict table component 308 may also change an appearance of a row, column, or cell to indicate a conflict, error, or the like. In one embodiment, the conflict table 700 may include highlighted cells of descriptions corresponding to the detected design conflicts. The highlighted cells may include different font, background, or other coloring than cells corresponding to non-conflicting descriptions. Similarly, cells corresponding to a first conflict type may be highlighted with different coloring than cells corresponding to a second conflict type. For example, FIG. 7 indicates that rows 30, 31, 33, 37, 38, 39, and 43 are displayed having a different color than the other rows. These colors may indicate visually for a user that a conflict, potential conflict, error, or the like has been detected with respect to a row. For example, the color red may be used to indicate that a requirement conflict has been detected, the color yellow may be used to indicate that a potential tolerance conflict has been detected, and grey may be used to indicate that an error with the description has been detected.

According to one embodiment, the conflict table component 308 may allow a user to modify the conflict table 700. For example, the user may be able to edit the conflict table similar to how a user might edit a spreadsheet. In one embodiment, changes by the user to the conflict table 700 may be applied to a corresponding function model. For example, a user may be able to fix an error, such as a missing design component name in the "Bill of Material" column, and a corresponding description of the function model map 602 and function model schematic 604 may be updated to reflect the change. In one embodiment, after making a change the user may select an option ("Process!") that causes the conflict detection component 304 to reprocess the conflict table to check for conflicts or other errors.

The relationship table component 310 manages a relationship table, such as the relationship table 800 of FIGS. 8A and 8B. The relationship table component 310 may modify the relationship table 800 based on instructions or information provided by other components, such as the description processing component 302 and the conflict detection component 304. For example, the relationship table component 310 modifies values and/or an appearance of cells of the relationship table 800 in response to the conflict detection component 304 detecting a conflict or error, or the description processing component 302 identifying a description or parsing a description into separate terms.

Similar to the conflict table 700, the relationship table 800 includes a plurality of cells organized into rows and columns. The rows each correspond to a description from the function model 500 of FIGS. 5A through 5G. The columns include a "Cell ID" column, a "Description" column, a "Conflict" column, a "Process Measurable Parameter" column, a "Reliability Black Dot Candidate" column, an "Upper Housing" column, a "Spring" column, a "Protector" column, a "Valve" column, a "Valve Seat" column, a "Diaphragm" column, a "Lower Housing" column, an "Inner Crimp Joint" column, and an "Outer Crimp Joint" column. Additional or fewer columns may be included in some embodiments.

Similar to the conflict table 700, the "Description" column of the relationship table 800 includes descriptions from a design function model 204 as processed by the description processing component 302. The "Conflict" column includes values indicating whether a conflict exists in relation to the description. For example, an "X" indicates the presence of a conflict. In one embodiment, different values may be used to indicate the type of content or the plurality of contents that exist in relation to a corresponding description. For example, an "X" may indicate the presence of a requirement conflict and a "Z" may indicate the presence of a potential tolerance conflict, while an "X, Z" may indicate the existence of both with respect to the corresponding description. The "Process Measurable Parameter" column includes a value to indicate whether a description has a measurable parameter. For example, the description corresponding to row cell ID 4.1.2.1.1 describes a function "Control valve stem height" that has a measurable parameter, specifically a height. The value within the "Reliability Black Dot Candidate" column may be used to indicate that the description relates to a design component name that has a need for reliability or durability testing.

The "Upper Housing," "Spring," "Protector," "Valve," "Valve Seat," "Diaphragm," "Lower Housing," "Inner Crimp Joint," and "Outer Crimp Joint" columns each include headings corresponding to design component names within a function model and/or bill of material 202. These columns, in the depicted embodiment, are used to track the presence of a particular design component name in a description. For example, a value of "1" is included in the "Inner Crimp Joint" column of rows 4.1 and 4.2 to indicate that the design component name "inner crimp joint" is found in the corresponding descriptions. When a different function model or bill of material is used, the column headings may be changed based on the design component names of the different function model or bill of materials. Thus, the number of columns and the headings may change based on the system or design that is being analyzed for conflicts.

In addition to populating cells within the relationship table 800 to indicate relationships between descriptions, terms, or the like, the relationship table component 310 may also change an appearance of a row, column, or cell to indicate a conflict, error, or the like. For example, multiple cells within the relationship table 800 of FIGS. 8A and 8B are shown highlighted to indicate a relationship or property of a description. For example, descriptions with measurable parameters are shown highlighted in the "Description" column.

The display component 312 displays information regarding a function model and/or detected conflicts. The display component 312 may provide data or instructions to the output component 115 of the conflict detection system 100 to display information such as a graphical user interface, a conflict table, a relationship table, statistical information, or other information on a display screen. The display component 312 may display information based on instructions or information generated by any other component 302, 304, 306, 308, 310, 314, and 316 of the design conflict component 125.

In one embodiment, the display component 312 provides a user interface to allow a user to view the information regarding the function model and/or the detected conflicts. For example, the display component 312 may provide the user interface 600 of FIG. 6 to display a function model map 602 and a function model schematic 604. The display component 312 may also provide user controls 606 to allow a user to interact with a conflict detection system. For example, the user may be able to select a bill of material 202, a design function model 204, a standard verb list 206, a standard noun list 208, or other files to use as input for detecting conflicts. Additionally, the user may be able to modify a function model, initiate conflict detection, and/or perform other functions using the interface 600.

Figure 9:
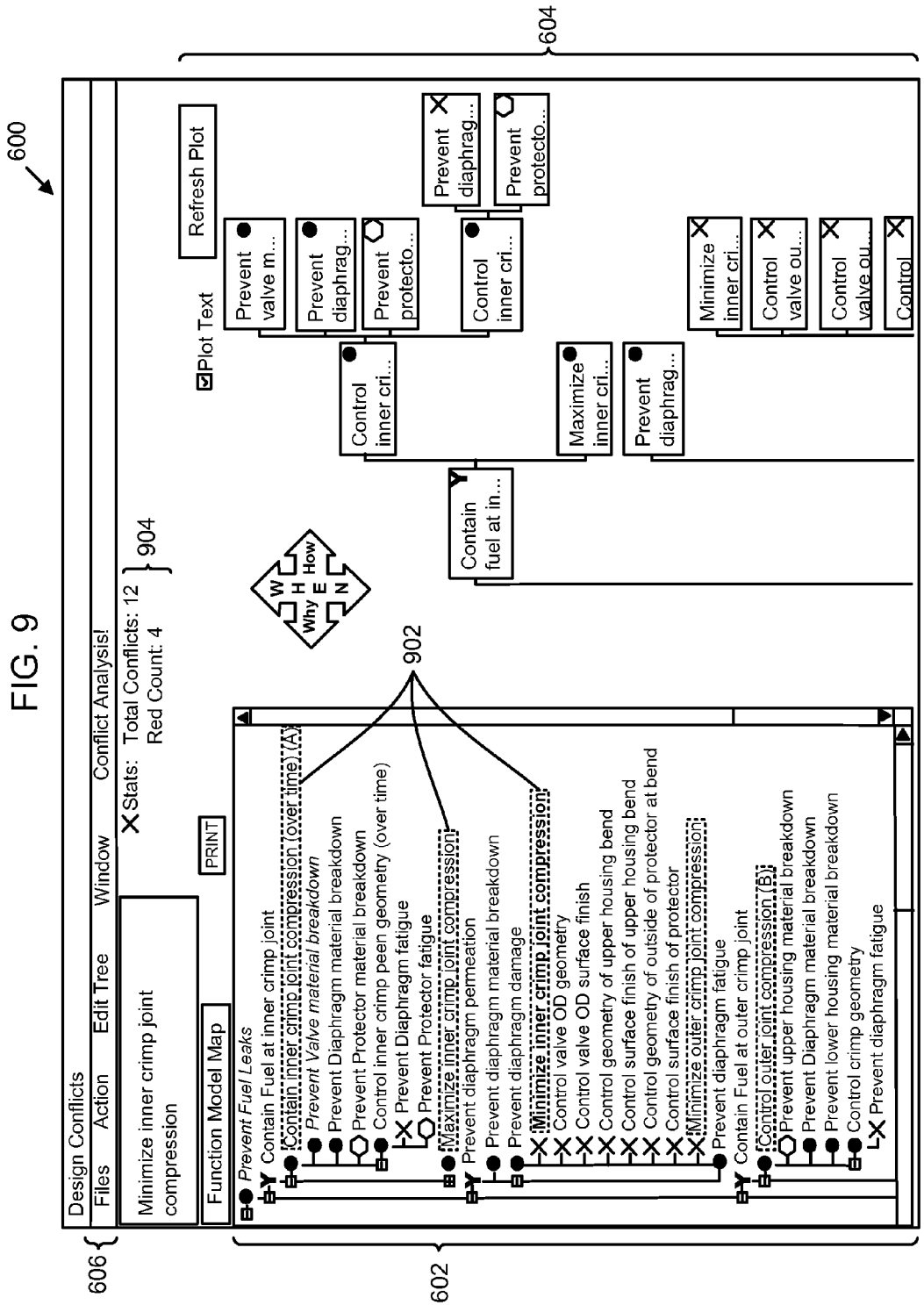
FIG. 9 illustrates a screenshot of a user interface displaying a function model map and a function model schematic following conflict detection consistent with embodiments disclosed herein.

FIG. 9 illustrates the user interface 600 of FIG. 6 after conflict detection has been run. For example, a user may be able to select "Conflict Analysis!" from the user controls 606 to perform conflict detection and the display component 312 may update the user interface 600 to indicate any detected conflicts. Specifically, conflicting descriptions 902 are shown highlighted in the function model map 602. Additionally, the updated user interface 600 of FIG. 9 includes conflict total information 904 regarding the conflicts detected. Specifically, the conflict total information 904 indicates that 12 conflicts have been detected and that they include four red (requirement) conflicts.

The display component 312 may also display other information such as the conflict table 700 of FIG. 7 and/or the relationship table 800 of FIGS. 8A and 8B.

The statistical component 314 may calculate statistical information based on a function model, a conflict table 700, a relationship table 800, or other information. For example, the statistical component 314 may calculate a total number of conflicts and/or the total number of each specific type of conflict. Similarly, the statistical component 314 may calculate the frequency with which a specific design component name, active verb, or descriptive noun is used. The statistical component 314 may also calculate a priority or ranking for a specific description and/or design component name. The priority may help a user to determine what portions of a designed system, product, or process should be changed or prioritized for revisions to improve the system. For example, the priority or ranking information may help guide a designer as to aspects that are most important to improve or that need to be focused on for future iterations.

FIG. 10 illustrates an example statistics window 1000. The statistics window 1000 may be displayed by the display component 312 based on calculations provided by the statistical component 314. The statistics window 1000 includes a conflict total section 1002, a component frequency section 1004, and a component conflict section 1006. The conflict total section 1002 displays a total number of conflicts, a total number of red conflicts (e.g., requirement conflicts), and a total number of yellow conflicts (e.g., potential tolerance conflicts). These number totals can provide an objective comparison between different systems or designs. For example, a system, product, or process that has fewer total conflicts may be more desirable to use because the design may have less likelihood of failure, may operate better, and/or may be easier to manufacture.

The component frequency section 1004 displays a ranked list of design component names based on the frequency with which the design component names are referenced in descriptions of a function model. For example, the "diaphragm" design component name was used the most, with nine total references. The component frequency section 1004 includes a caption "Reference Count Pareto List" to indicate that the list is organized according to the Pareto principle. The Pareto principle, also known as the 80-20 rule, states that 80 percent of results are due to 20 percent of the causes, or vice versa. Although the Pareto principle is widely used and interpreted, the Pareto principle will be used herein to reference any ranking to find a majority of results caused by a minority of causes. For example, only a few of the design component names account for the total number of references in the component frequency section 1004.

The component conflict section 1006 displays a ranked list of design component names based on the frequency with which design component names are referenced in a conflicting description. For example, the "diaphragm" design component name occurs in the most conflicting descriptions, with 8 conflicts. Similar to the component frequency section 1004, the component conflict section 1006 is organized based on the Pareto principle. For example, only a few of the design component names account for the total number of conflicts detected in the design, as listed in the component frequency section 1004. If these specific components were modified, the number of conflicts could be reduced dramatically. In one embodiment, the component conflict section 1006 may break down the number of conflicts relating to design component names based on the type of conflict. For example, the number of red conflicts (requirement conflicts) and yellow conflicts (potential tolerance conflicts) may be indicated for each design component name.

The storage component 316 stores data relating to a design of a system, product, or process. The storage component 316 may store a function model, conflict table, relationship table, statistical information, or other information about a design and/or any conflicts for the design, for later retrieval. Storage of the data relating to the design may allow designers to compare and/or track progress of the design as it relates to eliminating or reducing conflicts. Similarly, multiple designs can be processed using the design conflict component 125 and later compared as to conflicts within the designs. For example, the design conflict component 125 or a user may be able to objectively compare one design to another based on the conflicts detected. This can illustrate which design is best for a certain purpose or function. The compared designs may be an earlier version of a design and a later version of a design or may be separately developed designs.

Figure 11:
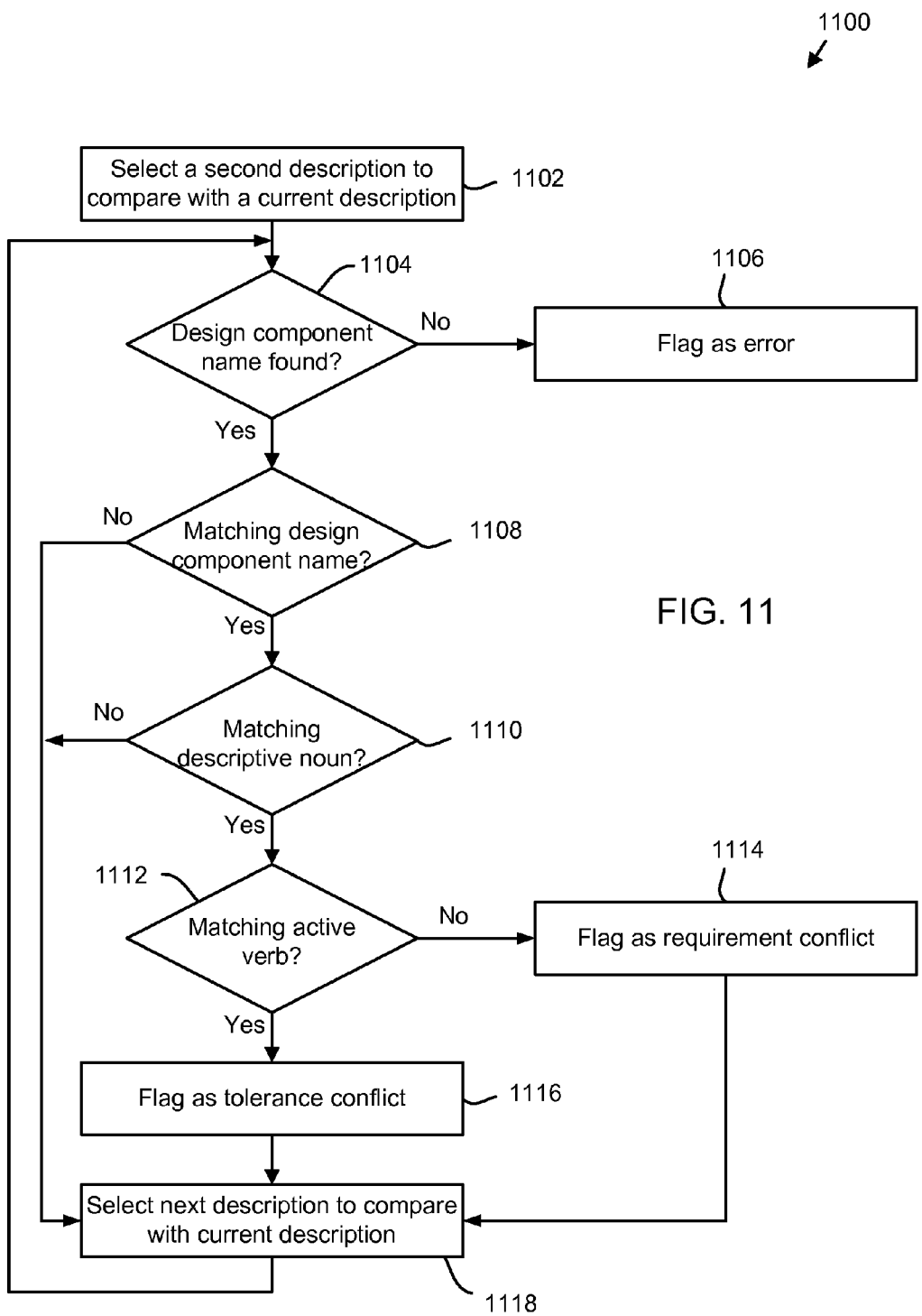
FIG. 11 is a schematic block diagram illustrating a method for detecting errors and conflicts consistent with embodiments disclosed herein.

Turning to FIG. 11, a schematic block diagram of a method 1100 for detecting errors and conflicts is shown. In one embodiment, the method 1100 is performed by the design conflict component 125 and/or conflict detection system 100. The method 1100 may be performed with each description within a function model.

The method 1100 begins, and the conflict detection component 304 selects 1102 a second description for conflict detection and determines 1104 whether a design component name is found in the current description. If a design component name is not found in the current description ("No" at 1104), the relationship component 306 flags 1106 the current description as having an error. The method 1100 may then end and restart after selecting a new current description.

If the design component name is found in the current description ("Yes" at 1104), the conflict detection component 304 determines 1108 whether the design component name matches a design component name of a second description. If the conflict detection component 304 determines 1108 that there is not a matching component name in the second description ("No" at 1108), the conflict detection component 304 selects 1118 a next description to compare with the current description. If there are no more descriptions to compare to the current description, the method 1100 may then end and restart after selecting a new current description.

If the conflict detection component 304 determines 1108 that there is a second description with a matching component name ("Yes" at 1108), the conflict detection component 304 determines 1110 whether a descriptive noun of the current description matches a descriptive noun of the second description. If the conflict detection component 304 determines 1110 that there is not a matching descriptive noun in the second description ("No" at 1110), the conflict detection component 304 selects 1118 a next description to compare with the current description. If there are no more descriptions to compare to the current description, the method 1100 may then end and restart after selecting a new current description.

If the conflict detection component 304 determines 1110 that there is a matching descriptive noun in the second description ("Yes" at 1110), the conflict detection component 304 determines 1112 whether an active verb of the current description matches an active verb of the second description. If the conflict detection component 304 determines 1112 that there is not a matching active verb in the second description ("No" at 1112), the relationship component 306 flags 1114 the current description as having a requirement conflict with the second description. If the conflict detection component 304 determines 1112 that there is a matching active verb in the second description ("Yes" at 1112), the relationship component 306 flags 1116 the current description as having a potential tolerance conflict with the second description.

The conflict detection component 304 may then select 1118 a next description to compare with the current description. If there are no more descriptions to compare to the current description, the method 1100 may then end and restart after selecting a new current description.

The method 1100 may be repeated until every description in a function model has been compared with every other description in the function model.

Figure 12:
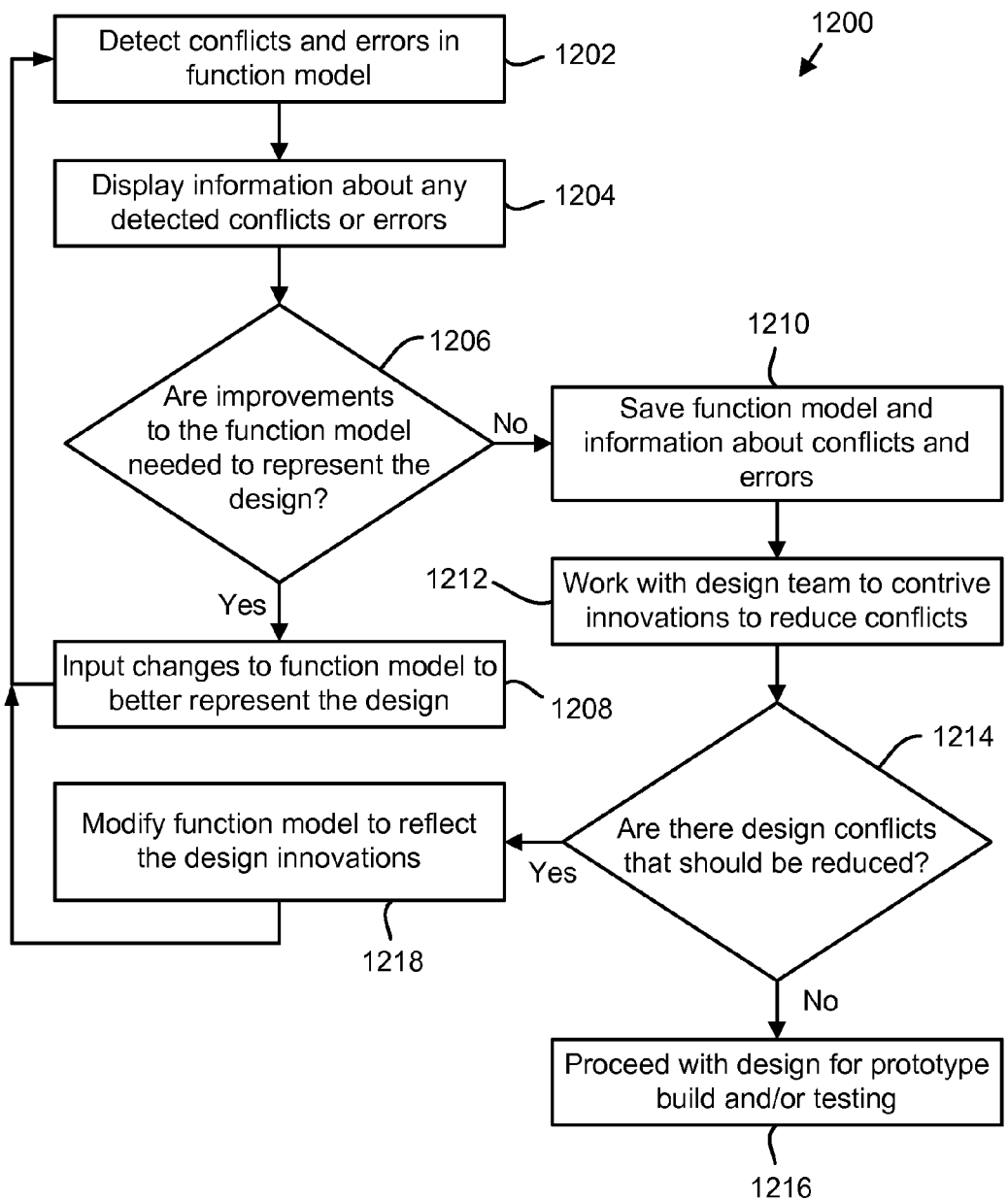
FIG. 12 is a schematic block diagram illustrating a method for designing a system, product, or process consistent with embodiments disclosed herein.

FIG. 12 is a schematic block diagram illustrating a method 1200 for designing a system, product, or process. The method 1200 may be performed using the design conflict component 125 and/or conflict detection system 100.

The method 1200 begins, and a design conflict component 125 detects 1202 conflicts and errors in a function model. For example, a design conflict component 125 may detect conflicts and errors in the manner depicted in relation to the method 1100 of FIG. 11.

A display component 312 displays 1204 information about any errors or conflicts detected by the design conflict component 125.

Using the information displayed 1204 by the display component 312, a user can determine whether 1206 a function model needs improvements to more accurately reflect a design. In one embodiment, a user may determine 1206 based on the presence of a detected error that a change needs to be made to the function model. For example, if the information displayed 1204 by the display component 312 indicates that there is no design component name in one of the descriptions, the user may determine 1206 that a design component name needs to be added.

If improvements are needed ("Yes" at 1206), the user can input 1208 changes to the function model. For example, the user may provide user input 210 into the conflict detection system 100 to change, add, or remove one or more descriptions of the function model. The method 1200 may then start over and the design conflict component 125 may detect 1202 conflicts and errors in a function model.

If improvements are not needed ("No" at 1206) to better reflect the current design (e.g. if no errors are detected 1202) the storage component 316 saves 1210 the function model and the information about any conflicts or errors in the function model. This saved model and information may then be used to track progress in the design or compare conflicts with other designs.

A user or designer may then work 1212 with a design team to contrive any further innovations or improvements to reduce conflicts or errors.

The user or designer may then determine 1214 whether there are conflicts that should be reduced. For example, if the design team cannot contrive any more innovations or the innovations are too expensive, the designer may determine 1214 that the conflicts cannot be reduced ("No" at 1214) and the designer or design team may proceed 1216 with the design for building a prototype and/or testing the design.

If the designer determines 1214 that the conflicts can be reduced ("Yes" at 1214) the designer or design team may modify 1218 the function model to reflect any design innovations. The method 1200 may then restart, and the design conflict component 125 may be used to detect 1202 conflicts and errors in the revised function model.

According to one embodiment, the above methods and teaching may be used to detect design conflicts and/or design a system, product, or process.

Turning now to FIGS. 13 through 16, an example scenario of design comparison will be discussed. A comparison of two different warship designs, the CSS Merrimac and the USS Monitor, will be made based on conflicts detected in their respective function models. These two ships faced off in a battle on Mar. 9, 1862 at Newport News, Va. The function models will be directed towards basic battle aspects of the ships.

Figure 13:
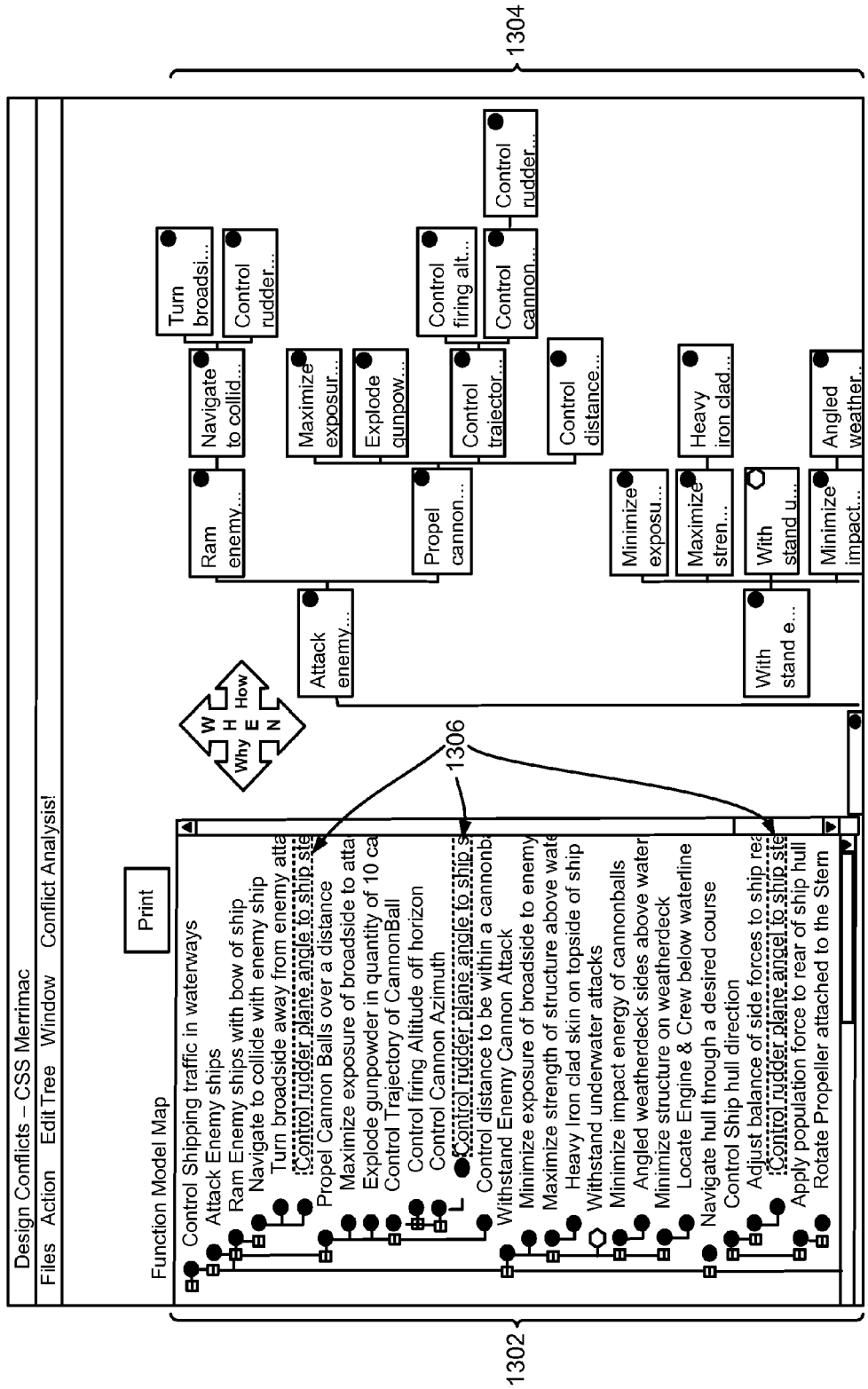
FIG. 13 illustrates a screenshot of a user interface displaying a function model map and a function model schematic for the CSS Merrimac consistent with embodiments disclosed herein.

FIG. 13 illustrates a user interface 1300 displaying a function model map 1302 and a function model schematic 1304 for the CSS Merrimac. The user interface 1300 is displayed by the display component 312 after a function model has been loaded into a conflict detection system 100 and the highlighted descriptions 1306 having conflicts have been detected. The highlighted descriptions 1306 are highlighted to show that they are in conflict. Specifically, each of the descriptions 1306 states "Control rudder plan angle to ship stern" and thus constitutes a potential tolerance conflicts.

FIG. 14 illustrates a user interface 1400 displayed by the display component 312 after detection of components and errors by the conflict detection component 304 of the CSS Merrimac. The user interface 1400 shows a conflict table 1402, a conflict count 1404, a reference count Pareto list 1406, and a conflict Pareto list 1408. Viewing this information about the conflicts shows that there are a total of 23 conflicts, with 14 requirement conflicts and 9 tolerance conflicts. The conflict Pareto list 1408 shows that there are 10 conflicts that relate to the ship, three that relate to the weatherdeck, three that relate to the rudder, three that relate to the stern, two that relate to the broadside of the ship, and two that relate to the cannons of the ship.

Reviewing the conflicts and potential conflicts shows that the rudder of the CSS Merrimac functions to steer the ship, aim cannons, and aim the ram on the bow. This highlights the fact that these three functions may all be in conflict because it may be difficult or impossible to ram a ship and shoot cannon balls at the same. Further review of the function model shows that the designers compensated for this by having 10 cannons pointing in many directions, including forward, to the sides, and at angles. However, this design compensation leads to a bigger and heavier ship that is difficult to maneuver in battle and also has a deeper hull so that shallow water operations are limited. Thus, even more conflicts for the CSS Merrimac to perform its functions are introduced through the use of additional cannons. Thus, the attempt to solve the steering, firing cannons, and ramming conflict has resulted in additional conflicts.

Figure 15:
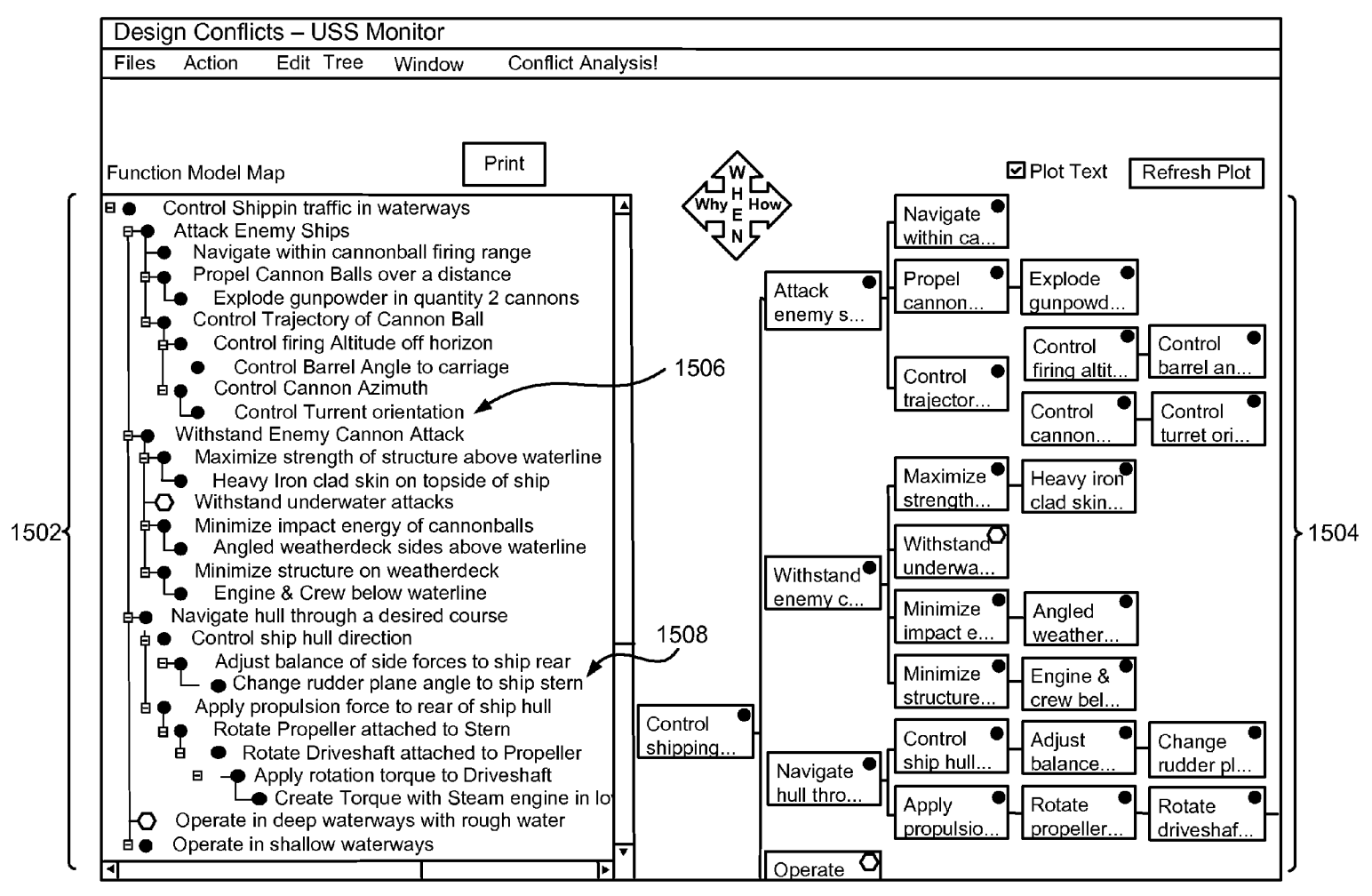

Turning to FIG. 15, a user interface 1500 displaying a function model map 1502 and a function model schematic 1504 for the USS Monitor is shown. The user interface 1500 reflects a display of the display component 312 after a function model has been loaded into a conflict detection system 100 and conflicts have been detected.

Descriptions 1506 and 1508 show that the rudder of the USS Monitor steers the ship (description 1508) while the turret keeps the function of aiming the cannons independent of steering the ship (description 1506). The USS Monitor has only two cannons in a turret that can rotate independent of the ship's rudder and orientation. This reduces the conflict between steering and firing cannons while maintaining the low weight of the ship.

Figure 16:
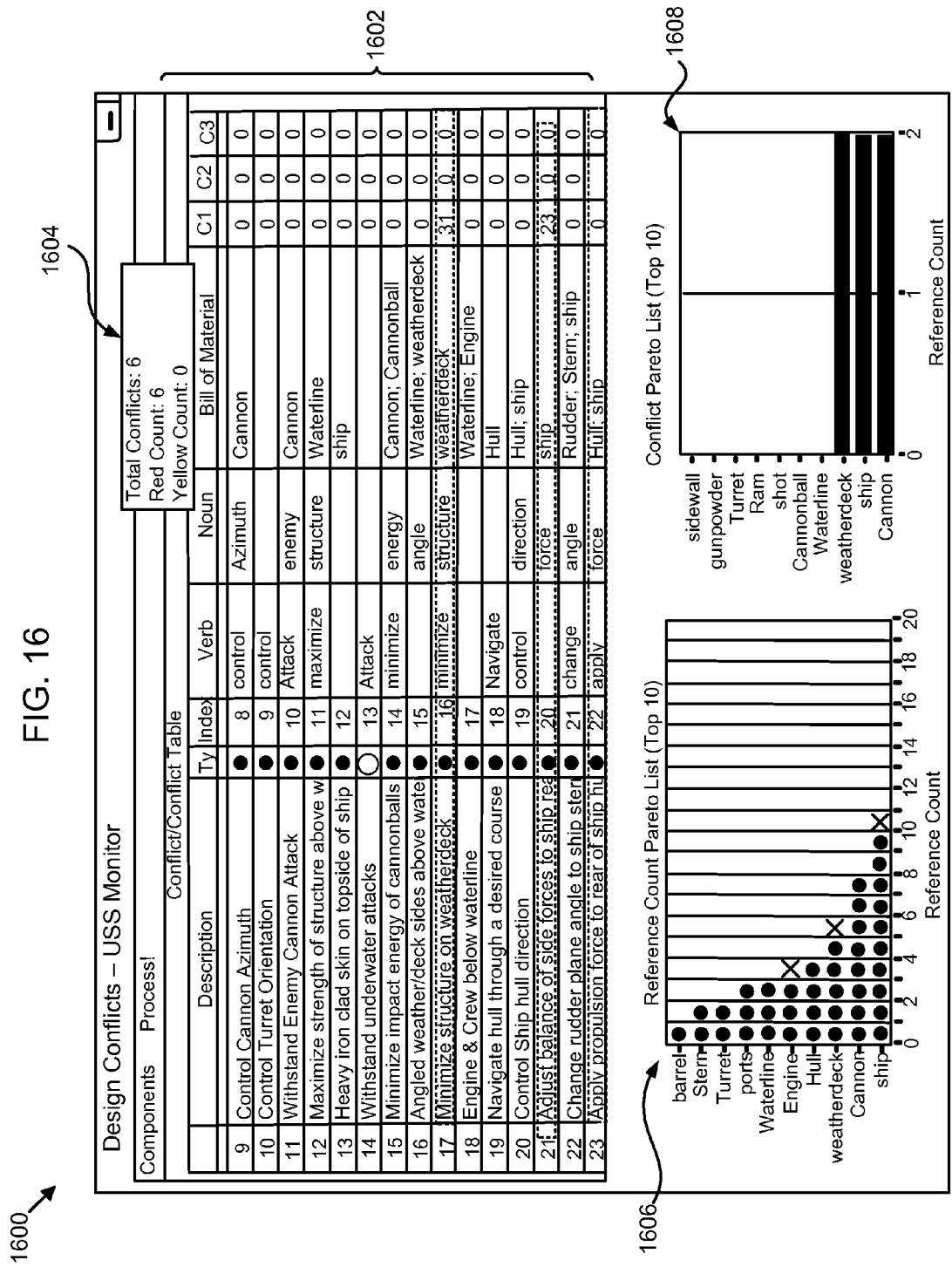
FIG. 16 illustrates a screenshot of a user interface displaying a conflict table, conflict totals, a reference count Pareto list, and a conflict Pareto list for the USS Monitor consistent with embodiments disclosed herein.

FIG. 16 illustrates a user interface 1600 displayed by the display component 312 after detection of components and errors by the conflict detection component 304 of the USS Monitor. The user interface 1600 shows a conflict table 1602, a conflict count 1604, a reference count Pareto list 1606, and a conflict Pareto list 1608. Viewing this information about the conflicts shows that there are a total of only six conflicts, with all six being requirement conflicts (red) and none being tolerance conflicts (yellow). The conflict Pareto list 1608 shows that there are two conflicts that relate to the cannon, two conflicts that relate to the ship, and two conflicts that relate to the weatherdeck.

By comparing the conflict numbers between the two ships, the USS Monitor scores objectively better, with six conflicts to the CSS Merrimac's 23. Even if the number of requirement conflicts is directly compared, the USS Monitor has less than half the requirement conflicts of the CSS Merrimac. On this basis, the USS Monitor is the superior design. The resulting fewer conflicts can be traced back to a cannon turret where two cannons were mounted.

This design has fewer of the previous tradeoffs in critical areas that the Merrimac exhibits. It weighs less, rides shallower, and can still fire cannons and steer independently. In fact, the USS Monitor went up against the CSS Merrimac and successfully protected the Union fleet on Mar. 9, 1862. Just two cannons did the job versus the 10 cannons of the CSS Merrimac.

Figure 17:
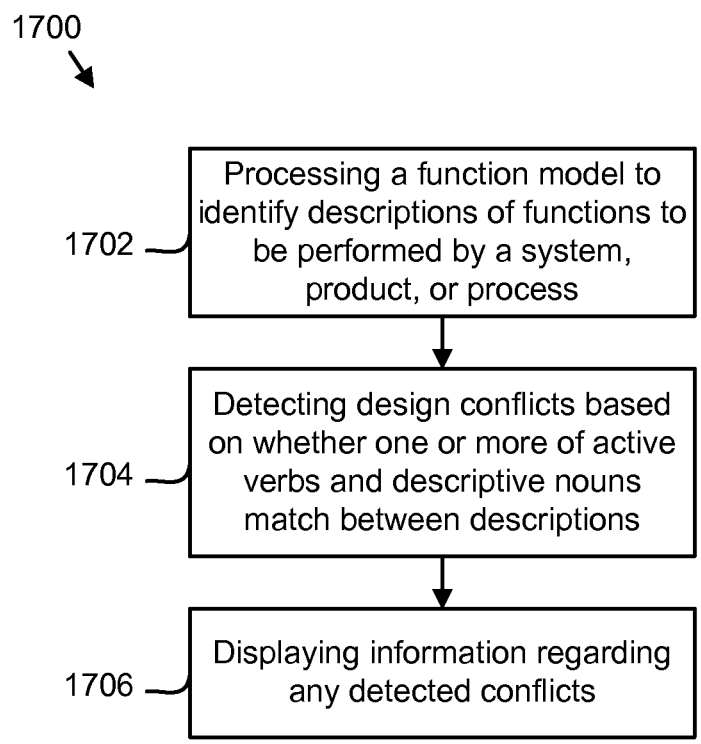
FIG. 17 is a schematic block diagram illustrating a method for detecting errors and conflicts consistent with embodiments disclosed herein.

FIG. 17 is a schematic flow chart diagram illustrating a method 1700 for detecting design conflicts. According to one embodiment, the method 1700 is performed by a conflict detection system 100.

The method begins, and a description processing component 302 processes 1702 a function model to identify descriptions of functions to be performed by a system, product, or process. The function model is a function model for the system, product, or process and may include dependencies between the functions to describe how, why, and when respective functions are performed.

A conflict detection component 304 detects 1704 design conflicts based on whether one or more of active verbs and descriptive nouns match between descriptions. The conflict detection component 304 may also detect 1704 whether a design component name matches between the descriptions. In one embodiment, the conflict detection component 304 and a relationship component 306 may detect 1704 and flag design conflicts using the method 1100 of FIG. 11.

A display component 312 displays 1706 information regarding any detected conflicts. For example, the display component 312 may display 1706 a highlighted function model map, a highlighted function model schematic, a conflict total, a conflict table, a relationship table, a reference count Pareto list, and/or a conflict Pareto list.

Some of the components that can be used with embodiments disclosed herein are already available, such as general-purpose computers, mobile phones, computer programming tools and techniques, digital storage media, and communications networks. A computing device, such as a laptop, tablet computer, desktop computer, server, Smartphone, or the like, may include a processor, such as a microprocessor, microcontroller, logic circuitry, or the like. The processor may include a special purpose processing device such as an ASIC, PAL, PLA, PLD, FPGA, or other customized or programmable device. The computing device may also include a computer-readable storage device such as non-volatile memory, static RAM, dynamic RAM, ROM, CD-ROM, disk, tape, magnetic, optical, flash memory, or other computer-readable storage medium.

Various aspects of certain embodiments may be implemented using hardware, software, firmware, or a combination thereof. As used herein, a software component may include any type of computer instruction or computer executable code located within or on a non-transitory computer-readable storage medium. A software component may, for instance, comprise one or more physical or logical blocks of computer instructions, which may be organized as a routine, program, object, component, data structure, etc., that performs one or more tasks or implements particular abstract data types.

In certain embodiments, a particular software component may comprise disparate instructions stored in different locations of a computer-readable storage medium, which together implement the described functionality of the component. Indeed, a component may comprise a single instruction or many instructions, and may be distributed over several different code segments, among different programs, and across several computer-readable storage media. Some embodiments may be practiced in a distributed computing environment where tasks are performed by a remote processing device linked through a communications network.

The systems and methods disclosed herein are not inherently related to any particular computer or other apparatus and may be implemented by a suitable combination of hardware, software, and/or firmware. Software implementations may include one or more computer programs comprising executable code/instructions that, when executed by a processor, may cause the processor to perform a method defined at least in part by the executable instructions. The computer program can be written in any form of programming language, including compiled or interpreted languages, and can be deployed in any form, including as a standalone program or as a module, component, subroutine, or other unit suitable for use in a computing environment. Further, a computer program can be deployed to be executed on one computer or on multiple computers at one site or distributed across multiple sites and interconnected by a communication network.

Software embodiments may be implemented as a computer program product that comprises a non-transitory storage medium configured to store computer programs and instructions that, when executed by a processor, are configured to cause the processor to perform a method according to the instructions. In certain embodiments, the non-transitory storage medium may take any form capable of storing processor-readable instructions on a non-transitory storage medium. A non-transitory storage medium may be embodied by a compact disk, digital-video disk, a magnetic tape, a Bernoulli drive, a magnetic disk, a punch card, flash memory, integrated circuits, or any other non-transitory digital processing apparatus memory device.

Although the foregoing has been described in some detail for purposes of clarity, it will be apparent that certain changes and modifications may be made without departing from the principles thereof. It should be noted that there are many alternative ways of implementing the processes, apparatuses, and system described herein. Accordingly, the present embodiments are to be considered illustrative and not restrictive, and the invention is not to be limited to the details given herein, but may be modified within the scope and equivalents of the appended claims.

As used herein, the terms "comprises," "comprising," and any other variation thereof are intended to cover a non-exclusive inclusion, such that a process, a method, an article, or an apparatus that comprises a list of elements does not include only those elements but may include other elements not expressly listed or inherent to such process, method, system, article, or apparatus.

It will be obvious to those having skill in the art that many changes may be made to the details of the above-described embodiments without departing from the underlying principles of the invention. The scope of the present invention should, therefore, be determined only by the following claims.

The invention claimed is:

1. A computer-implemented method for detecting design conflicts of a product or a process, the method comprising:
    processing, using a processor, a function model of a product or a process to identify a plurality of descriptions of functions to be performed by the product or the process, the function model identifying dependencies between the functions to describe how, why, and when respective functions are performed;
    detecting, using the processor, in the plurality of descriptions a first description and a second description, wherein the first description comprises a first design component name that matches a second design component name of the second description, a first descriptive noun that matches a second descriptive noun of the second description, and a first active verb that does not match a second active verb of the second description;
    flagging, using the processor, a relationship between the first description and the second description as a first conflict type; and
    displaying, on a display device, information regarding the first conflict type.

2. The computer-implemented method of claim 1, wherein the displaying information regarding the first conflict type comprises displaying a conflict table, wherein the conflict table comprises highlighted cells of descriptions corresponding to conflicts of the first conflict type.

3. The computer-implemented method of claim 2, wherein the highlighted cells comprise different coloring than cells corresponding to non-conflicting descriptions.

4. The computer-implemented method of claim 3, wherein cells corresponding to the first conflict type are highlighted with different coloring than cells corresponding to a second conflict type.

5. The computer-implemented method of claim 1, wherein the displaying information regarding the first conflict type comprises displaying a count of detected conflicts.

6. The computer-implemented method of claim 5, wherein the displaying the count of detected conflicts comprises displaying one or more of a total number of detected conflicts, a number of conflicts of the first conflict type, and a number of conflicts of a second conflict type.

7. The computer-implemented method of claim 1, further comprising detecting and flagging one or more additional relationships between descriptions having the first conflict type.

8. The computer-implemented method of claim 1, further comprising:
    detecting, in the plurality of descriptions, a third description and a fourth description, wherein the third description comprises a third design component name that matches a fourth design component name of the fourth description, a third descriptive noun that matches a fourth descriptive noun of the fourth description, and a third active verb that matches a fourth active verb of the fourth description; and
    flagging a relationship between the third description and the fourth description as a second conflict type.

9. The computer-implemented method of claim 8, wherein the flagging the relationship between the third description and the fourth description as a second conflict type comprises flagging the relationship as a potential tolerance conflict.

10. The computer-implemented method of claim 8, further comprising detecting and flagging one or more additional relationships between descriptions having the second conflict type.

11. The computer-implemented method of claim 1, further comprising detecting a description that does not include one or more of a design component name, a descriptive noun, or an active verb.

12. The computer-implemented method of claim 11, wherein the detecting that a description that does not include one or more of the design component name, the descriptive noun, or the active verb comprises determining that the description does not include a term that matches one or more of a descriptive noun, an active verb, or a design component name from a standard term list.

13. The computer-implemented method of claim 11, wherein the detecting that the description that does not include one or more of the design component name, the descriptive noun, or the active verb comprises determining that the description does not include a term that matches one or more of a descriptive noun, an active verb, or a design component name from a bill of materials.

14. The computer-implemented method of claim 1, further comprising comparing a first design with a second design based on a number of conflicts within each design.

15. The computer-implemented method of claim 14, wherein the comparing a first design with a second design comprises comparing an earlier version of a design with a later version of the design.

16. The computer-implemented method of claim 14, wherein the comparing a first design with a second design comprises comparing separately developed designs.

17. A system for detecting design conflicts of a product or a process, the system comprising:
a description processing component configured to process a function model of a product or a process to identify a plurality of descriptions of functions to be performed by the product or the process;
a conflict detection component configured to detect design conflicts based on whether one or more of design component names, active verbs, and descriptive nouns match between a first description and a second description of the plurality of descriptions; and
a display component configured to display information regarding any detected design conflicts.

18. The system of claim 17, wherein the conflict detection component detecting design conflicts comprises detecting that the first description comprises a first design component name that matches a second design component name of the second description, a first descriptive noun that matches a second descriptive noun of the second description, and a first active verb that does not match a second active verb of the second description.

19. The system of claim 18, wherein the conflict detection component detects the first description and the second description as comprising a requirement conflict.

20. The system of claim 17, wherein the conflict detection component detecting design conflicts comprises detecting that the first description comprises a first design component name that matches a second design component name of the second description, a first descriptive noun that matches a second descriptive noun of the second description, and a first active verb that matches a second active verb of the second description.

21. The system of claim 20, wherein the conflict detection component detects the first description and the second description as comprising a potential tolerance conflict.

22. The system of claim 17, wherein the display component displaying information regarding the detected design conflicts comprises displaying a conflict table, wherein the conflict table comprises highlighted cells of descriptions corresponding to the detected design conflicts.

23. The system of claim 22, wherein the highlighted cells comprise different coloring than cells corresponding to non-conflicting descriptions.

24. The system of claim 23, wherein cells corresponding to a first conflict type are highlighted with different coloring than cells corresponding to a second conflict type.

25. The system of claim 17, wherein the display component displaying information regarding the detected design conflicts comprises displaying a relationship table, the relationship table graphed according to the plurality of descriptions on a first axis and the design component names on a second axis.

26. The system of claim 25, wherein a cell corresponding to a description and a design component name of the design component names is marked to indicate usage of the design component name when the design component name is in the description.

27. The system of claim 25, wherein a cell corresponding to a description is marked to indicate presence of a conflict when the description has a conflict relationship with another description.

28. The system of claim 17, wherein the display component displaying information regarding the detected design conflicts comprises displaying a count of the detected design conflicts.

29. The system of claim 17, wherein the display component is further configured to display a schematic of the function model on a display.

30. The system of claim 29, wherein the function model is displayed to include the plurality of descriptions of functions represented as nodes and wherein positions of nodes together with connections between the nodes identify dependencies between the plurality of descriptions of functions to describe how, why, and when respective functions are performed.

31. The system of claim 17, further comprising a storage component configured to save conflict information for a design.

32. The system of claim 17, further comprising a statistical component configured to identify a minority of design component names that correspond to a majority of conflicts.

33. The system of claim 17, further comprising a statistical component configured to determine a ranked list of design component names in an order based on a number of conflicts relating to the design component names, wherein the display component displays the ranked list.

34. The system of claim 17, wherein the function model comprises information identifying dependencies between the functions to describe how, why, and when respective functions are performed.

35. A method for detecting design conflicts of a product or a process, the method comprising:
processing, using a processor, a function model of a product or a process to identify a plurality of descriptions of functions to be performed by the product or the process;
detecting, using the processor, design conflicts based on whether one or both of active verbs and descriptive nouns match between a first description and a second description of the plurality of descriptions; and displaying, using the processor, information regarding any detected design conflicts.

36. The method of claim 35, wherein the function model comprises information identifying dependencies between the functions to describe how, why, and when respective functions are performed.

37. The method of claim 35, wherein the detecting design conflicts comprises detecting that the first description comprises a first design component name that matches a second design component name of the second description, a first descriptive noun that matches a second descriptive noun of the second description, and a first active verb that does not match a second active verb of the second description.

38. The method of claim 35, wherein the detecting design conflicts comprises detecting that the first description comprises a first design component name that matches a second design component name of the second description, a first descriptive noun that matches a second descriptive noun of the second description, and a first active verb that matches a second active verb of the second description.

* * * * *